US012015397B2

(12) United States Patent
Phung

(10) Patent No.: US 12,015,397 B2
(45) Date of Patent: Jun. 18, 2024

(54) HIGH CONNECTIVITY PARAMETRIC GATE

(71) Applicant: International Business Machines Corporation, Armonk, NY (US)

(72) Inventor: Timothy Phung, Milpitas, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 121 days.

(21) Appl. No.: 17/820,721

(22) Filed: Aug. 18, 2022

(65) Prior Publication Data

US 2024/0063791 A1    Feb. 22, 2024

(51) Int. Cl.
*H03K 17/92* (2006.01)
*G06N 10/40* (2022.01)
*H10N 60/12* (2023.01)
*H10N 69/00* (2023.01)

(52) U.S. Cl.
CPC ............ *H03K 17/92* (2013.01); *G06N 10/40* (2022.01); *H10N 60/12* (2023.02); *H10N 69/00* (2023.02)

(58) Field of Classification Search
CPC ...................................................... H03K 17/92
USPC ......................................................... 327/528
See application file for complete search history.

(56) References Cited

U.S. PATENT DOCUMENTS

| 9,710,758 | B2 | 7/2017 | Bunyk et al. |
| 10,074,792 | B1* | 9/2018 | Ferguson ............... G06N 10/60 |
| 10,467,545 | B2 | 11/2019 | Harris |
| 10,657,455 | B2 | 5/2020 | Barzegar et al. |
| 11,600,658 | B2* | 3/2023 | Finck ..................... H10N 69/00 |
| 2021/0192380 | A1* | 6/2021 | Jin ......................... H03K 19/195 |
| 2023/0409942 | A1* | 12/2023 | Sete ....................... G06N 10/20 |
| 2024/0013088 | A1* | 1/2024 | Kapit ..................... G06N 10/40 |

FOREIGN PATENT DOCUMENTS

WO    2021195368 A1    9/2021

OTHER PUBLICATIONS

International Search Report and Written Opinion received for PCT Application Serial No. PCT/IB2023/058902 dated Nov. 9, 2023, 10 pages.

(Continued)

*Primary Examiner* — Tomi Skibinski
(74) *Attorney, Agent, or Firm* — Amin, Turocy & Watson, LLP

(57) ABSTRACT

One or more systems, devices, and/or methods of manufacture and/or use provided herein relate to a quantum computing process to achieve higher connectivity of qubits to more than nearest neighbors and/or to a plurality of nearest neighbors. A system can comprise a tunable first coupler coupled to a first qubit, a tunable second coupler coupled to a second qubit, and a junction coupling the first coupler and the second coupler being both parametrically drivable. The first coupler and the second coupler can comprise superconducting quantum interference devices or Josephson junctions. The junction can comprise a central hub or central node separately coupled to the first coupler and the second coupler. The first coupler and the second coupler can be configured to capacitively or inductively couple the first qubit and the second qubit to one another to perform a control-Z (CZ) gate or an iSWAP gate.

20 Claims, 15 Drawing Sheets

(56) References Cited

OTHER PUBLICATIONS

Karli et al., "SUPER Scheme in Action: Experimental Demonstration of Red-detuned Excitation of a Quantum Dot", arXiv:2203.00712v1, Mar. 1, 2022, 11 pages.
Hazra, et al., "Long-range connectivity in a superconducting quantum processor using a ring resonator," Phys. Rev. Applied 16, 024018 (2021), arXiv:2012.09463v1 [quant-ph] Dec. 17, 2020, 16 pages.
Lu, et al., "APS March Meeting 2021 Demonstration of a Multi-Qubit Gate for All-to-All Connected Superconducting Qubits," vol. 66, No. 1, https://meetings.aps.org/Meeting/MAR21/Session/S30.9, Mar. 18, 2021, 1 page.
Stassi, et al., "Scalable quantum computer with superconducting circuits in the ultrastrong coupling regime," npj Quantum Information vol. 6, Article No. 67 (Aug. 6, 2020), 6 pages.
Roy, et al., "A programmable three-qubit superconducting processor with all-to-all connectivity," Phys. Rev. Applied 14, 014072 (2020), arXiv:1809.00668v1 [quant-ph] Sep. 3, 2018, 11 pages.
McKay, et al., "A universal gate for fixed-frequency qubits via a tunable bus," Phys. Rev. Applied 6, 064007 (2016), arXiv:1604.03076v3 [quant-ph] Dec. 19, 2016, 10 pages.
McKay, et al., "High contrast qubit interactions using multimode cavity QED," Phys. Rev. Lett. 114, 080501 (2015), arXiv:1402.7036v2 [quant-ph] Oct. 22, 2014, 6 pages.
Li, et al., "Perfect Quantum State Transfer in a Superconducting Qubit Chain with Parametrically Tunable Couplings," PR. App. 10, 054009 (Jun. 14, 2018) DOI: 10.1103/PhysRevApplied.10.054009, 11 pages.
Reagor, et al., "Demonstration of Universal Parametric Entangling Gates on a Multi-Qubit Lattice," Science Advances Feb. 2, 2018: vol. 4, No. 2, eaao3603, arXiv:1706.06570v3 [quant-ph] Feb. 27, 2018, 17 pages.
Nakano, et al., "Long-range and selective coupler for superconducting flux qubits," arXiv:0705.1405v2 [cond-mat.supr-con] May 23, 2007, 10 pages.
Yan, et al., "A tunable coupling scheme for implementing high-fidelity two-qubit gates," Phys. Rev. Applied 10, 054062 (2018), arXiv:1803.09813v1 [quant-ph] Mar. 26, 2018, 10 pages.
Mell et al., The NIST Definition of Cloud Computing, Recommendations of the National Institute of Standards and Technology, NIST Special Publication 800-145, Sep. 2011, 7 pages.
International Search Report and Written Opinion for International Application No. PCT/IB2023/058141 dated Nov. 7, 2023.
D. L. Campbell et al: "Modular tunable coupler for superconducting qubits", 6-13, 16, Arxiv.Org, Cornell University Library, 201 17,19,20 Olin Library Cornell University Ithaca, NY 14853, Jul. 14, 2022 (Jul. 14, 2022), XP091270909, DOI: 10.48550/arXiv.2207.06607 figures 1-4; corresponding explanations.
C. Zhou et al: "A modular quantum computer based on a quantum state router", Arxiv.Org, Cornell University Library, 201 Olin Library Cornell University Ithaca, NY 14853, Apr. 11, 2022 (Apr. 11, 2022), XP091194484, DOI: 10.48550/arXiv.2109.06848 sections II and III Supplementary Information, sections III and IV.
J. Chu et al: "Scalable algorithm simplification using quantum AND logic", Arxiv.Org, Cornell University Library, 201 Olin Library Cornell University Ithaca, NY 14853, Dec. 30, 2021 (Dec. 30, 2021), XP091368282, DOI: 10.48550/arXiv.2112.14922 figures 2 and S6; corresponding explanations.

\* cited by examiner

HIGH CONNECTIVITY PARAMETRIC GATE

TECHNICAL FIELD

The present disclosure relates to execution of a quantum circuit at a quantum device, and more particularly to execution of a parametric gate employing qubits having high interconnectivity to one another.

BACKGROUND

In quantum computing systems, it can be challenging to couple qubits over long distances without affecting quality of qubit measurements and/or state of one or more of the coupled or adjacent qubits of a system having a plurality of qubits. These challenges can increase as quantum computing devices expand in size and quantity of qubits.

SUMMARY

The following presents a summary to provide a basic understanding of one or more embodiments described herein. This summary is not intended to identify key or critical elements, and/or to delineate scope of particular embodiments or scope of claims. Its sole purpose is to present concepts in a simplified form as a prelude to the more detailed description that is presented later. In one or more embodiments described herein, systems, computer-implemented methods, apparatuses and/or computer program products can provide a process to couple qubits and to activate one or more couplings that are coupling together the qubits.

Generally, an electronic device can be provided that can use all-to-all connectivity between a plurality of qubits, and which can allow for operation of parametric gates.

In accordance with an embodiment, an electronic device can comprise a tunable first coupler coupled to a first qubit, a tunable second coupler coupled to a second qubit, and a junction coupling the first coupler and the second coupler, wherein the first coupler and the second coupler are parametrically drivable.

An advantage of the above-indicated electronic device can be higher quantum volume and improved quantum algorithm implementations and/or demonstrations. This can be due to reduction in gates, reduction in swaps, and/or reduced error (or less introduction of error).

In accordance with another embodiment, a method of performing a quantum gate operation can comprise applying, by a system operatively coupled to a processor, a first bias and a first parametric drive to a first coupler coupled to a first qubit, applying, by the system, a second bias and a second parametric drive to a second coupler coupled to a second qubit and to the first coupler, and performing, by the system, a parametric gate operation employing the first qubit and the second qubit.

An advantage of the above-indicated method can be higher quantum volume and improved quantum algorithm implementations and/or demonstrations. This can be due to reduction in gates, reduction in swaps, and/or reduced error (or less introduction of error).

In accordance with still another embodiment, an electronic device can comprise a plurality of tunable couplers, comprising a superconducting quantum interference devices, and separately coupled to a respective qubit, and a junction coupling the plurality of tunable couplers by all-to-all coupling, wherein the plurality of tunable couplers are not otherwise coupled to one another other than by the junction, and wherein the first coupler and the second coupler are parametrically drivable.

An advantage of the above-indicated electronic device can be higher quantum volume and improved quantum algorithm implementations and/or demonstrations. This can be due to reduction in gates, reduction in swaps, and/or reduced error (or less introduction of error).

Yet another advantage of the one or more embodiments described herein can be use of plural electronic devices and/or systems in combination with one another to reduce thermal population of loading.

Still another advantage of the one or more embodiments described herein can be execution of plural high connectivity operations, such as at least partially at a same time as one another, employing a same electronic device and/or system, such as having four or more qubits. Indeed, such electronic device can employ a single junction that is separately coupled to each of the four qubits.

The one or more innovations, frameworks, systems, devices and/or methods described herein can be additionally, and/or alternatively described as follows:

An electronic device can comprise a tunable first coupler coupled to a first qubit, a tunable second coupler coupled to a second qubit; and a junction coupling the first coupler and the second coupler, wherein the first coupler and the second coupler are parametrically drivable.

In accordance with the electronic device, the first coupler and the second coupler can comprise superconducting quantum interference devices or Josephson junctions.

In accordance with the electronic device of any previous paragraph of this section, the junction can comprise a central hub or central node separately coupled to the first coupler and the second coupler.

In accordance with the electronic device of any previous paragraph of this section, the junction can comprise a central hub, and, optionally, the central hub can comprise a loop of series-coupled inductors.

The electronic device of any previous paragraph of this section further can comprise a third coupler coupled to a third qubit, wherein the junction can couple the first coupler, the second coupler and the third coupler, wherein, optionally, the third coupler can be parametrically drivable, wherein, optionally, the junction can be separately coupled to the first coupler, the second coupler and the third coupler.

In accordance with the electronic device of any previous paragraph of this section, the junction can provide the only coupling between the first qubit and the second qubit.

In accordance with the electronic device of any previous paragraph of this section, the first coupler and the second coupler can be configured to capacitively or inductively couple the first qubit and the second qubit to one another, and, optionally, can be configured to perform a controlled-Z (CZ) gate employing the first qubit and the second qubit.

In accordance with the electronic device of any previous paragraph of this section, the first coupler and the second coupler can be configured to capacitively or inductively couple the first qubit and the second qubit to one another, and, optionally, can be configured to perform an iSWAP gate employing the first qubit and the second qubit.

A method of performing a quantum gate operation can comprise applying, by a system operatively coupled to a processor, a first bias and a first parametric drive to a first coupler coupled to a first qubit, applying, by the system, a second bias and a second parametric drive to a second coupler coupled to a second qubit and to the first coupler, and performing, by the system, a parametric gate operation employing the first qubit and the second qubit.

The method further can comprise applying, by the system, the first parametric drive and the second parametric drive at a respective frequency of a difference of respective frequencies of the first qubit and the second qubit.

The method of any previous paragraph of this section further can comprise applying, by the system, the first parametric drive and the second parametric drive when the first qubit is in a respective excited state and the second qubit is in a respective excited state.

The method of any previous paragraph of this section further can comprise applying, by the system, the first parametric drive and the second parametric drive at a respective frequency of a difference of respective frequencies of the first qubit and the second qubit plus or minus an anharmonicity of the first and second qubits.

The method of any previous paragraph of this section further can comprise applying, by the system, the first parametric drive and the second parametric drive when one of the first qubit or the second qubit is in a respective excited state, and the other of the first qubit or the second qubit is in a respective ground state.

The method of any previous paragraph of this section further can comprise inductively coupling, by the system, the first coupler and the second coupler by a pair of radio frequency superconducting quantum interference devices of the first coupler and the second coupler.

The method of any previous paragraph of this section further can comprise capacitively coupling, by the system, the first coupler and the second coupler by a single coupling node.

The method of any previous paragraph of this section further can comprise applying, by the system, a third bias and a third parametric drive to a third coupler coupled to a third qubit, optionally applying, by the system, a fourth bias and a fourth parametric drive to a fourth coupler coupled to a fourth qubit, and optionally performing, by the system, in parallel with the parametric gate operation, a second parametric gate operation employing the third qubit and the fourth qubit, wherein the first coupler, the second coupler, the third coupler and the fourth coupler are optionally coupled to one another by a single junction.

An electronic device can comprise a plurality of tunable couplers, comprising superconducting quantum interference devices, and separately coupled to respective qubit, and a junction coupling the plurality of tunable couplers by all-to-all coupling, wherein the first coupler and the second coupler are parametrically drivable.

In accordance with the electronic device, the junction can comprise a central hub, wherein, optionally, the central hub can comprise a loop of series-coupled inductors, and wherein, optionally, the number of series-coupled inductors can be equal to the number of tunable couplers of the plurality of tunable couplers.

In accordance with the electronic device of any previous paragraph of this section, the plurality of tunable couplers can be configured to capacitively or inductively couple a pair of the respective qubits to one another, and, optionally, can be configured to perform a controlled-Z (CZ) gate or an iSWAP gate employing the pair of the respective qubits.

In accordance with the electronic device of any previous paragraph of this section, the plurality of tunable couplers and the junction can be jointly configured to perform a first parametric gate operation employing a pair of tunable couplers of the plurality of tunable couplers, and to optionally perform, in parallel with the first parametric gate operation, a second parametric gate operation employing a pair of different tunable couplers of the plurality of tunable couplers.

DETAILED DESCRIPTION

Figure 1:
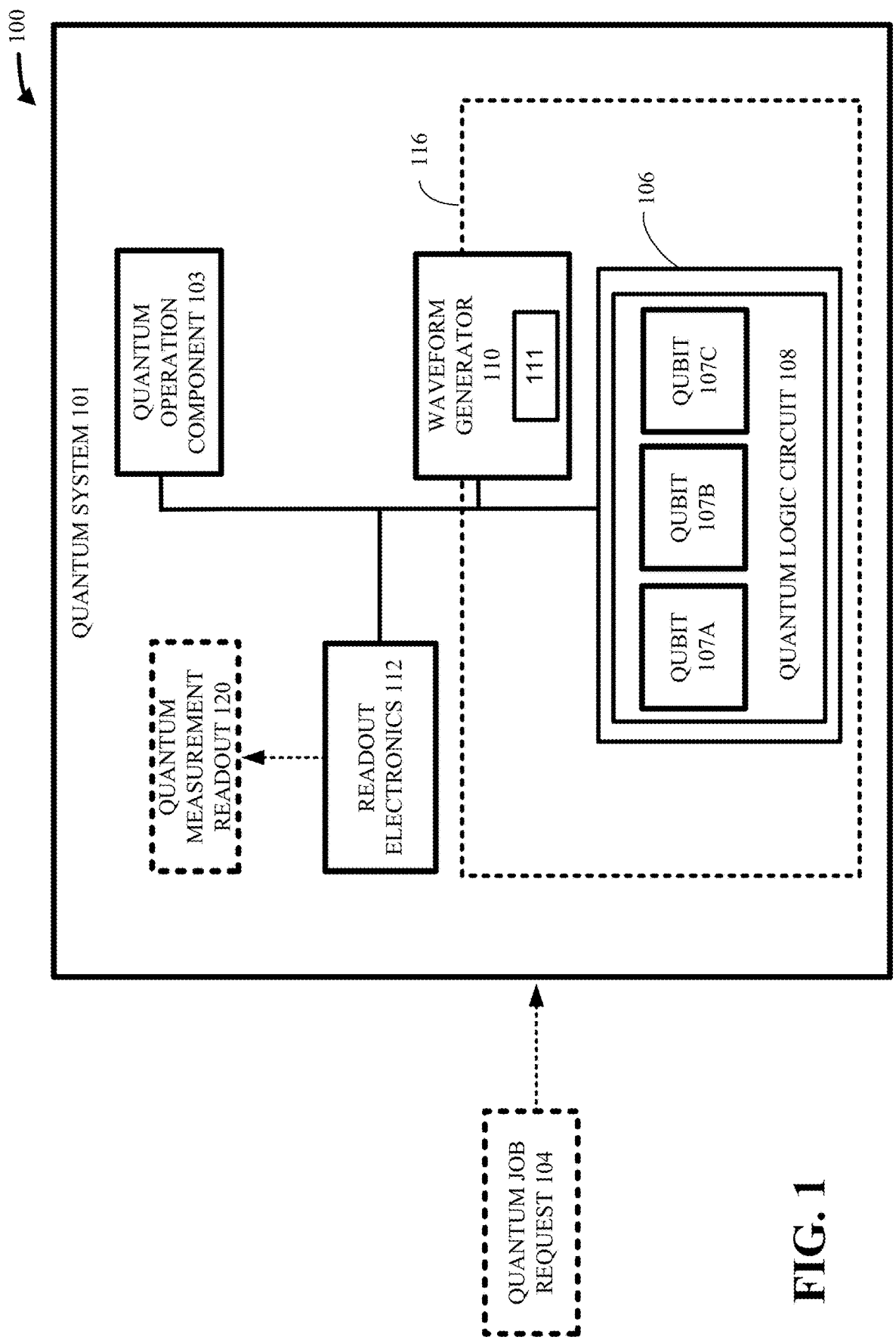
FIG. 1 illustrates a schematic view of a quantum system, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As used herein, a quantum circuit can comprise a set of operations, such as gates, performed on a set of real-world physical qubits with the purpose of obtaining one or more qubit measurements. A quantum processor can comprise the one or more real-world physical qubits. Generally, in a quantum device, a pair of superconducting Josephson junction qubits (e.g., transmon qubits) can be capacitively coupled to a length of co-planar waveguide.

Execution of quantum gates of a quantum device can be complicated by coupling limitations of qubits to one another. Not adhering to the limits can affect quality of qubit measurements and/or state of one or more of the coupled or adjacent qubits, such as due to the nature (e.g., hardware) employed for the coupling. Even adhering to the limits can result in additional gate operations due to the coupling limitations that are adhered to.

These limits can respectively limit modularity of, arrangement of, and/or distances between qubits and/or qubit-chips comprising the qubits. This limited arrangement itself can limit the types of operations (e.g., quantum gates) that can be executed. Further the hardware employed to couple qubits generally can, in one or more cases, introduce some error, such as some level of decoherence and/or some level of quantum noise, affecting qubit availability and/or coherence. Quantum noise can refer to noise attributable to the discrete and/or probabilistic natures of quantum interactions. For example, in conventional superconducting processors of quantum devices, connectivity of qubits is conventionally limited to nearest neighbor qubits. Operations that employ quantum information transfer beyond nearest neighbors causes additional swap operations to be employed. These additional operations can introduce error and/or increase circuit depth. Circuit depth refers to the length of the quantum circuit being performed (e.g., quantity of gates). A longer quantum circuit can spend more coherence time of one or more qubits, thus reducing coherency availability relative to longer quantum circuits and/or other quantum operations to be performed.

Accordingly, reducing limits on qubit connectivity can be desired. Having higher connectivity, such as connection to more than just nearest neighbors, and/or connection to a plurality of nearest neighbors, can benefit quantum volume. Quantum volume can refer to the number of gates able to be performed in a quantum operation relative to qubit coherency and/or system noise. Quantum volume alternatively and/or additionally can refer to the number of quantum circuits, such as repeat execution of quantum circuits, that can be performed relative to qubit coherency and/or system noise.

One or more embodiments are now described with reference to the drawings, where like referenced numerals are used to refer to like elements throughout.

As used herein, the terms "entity", "requesting entity", and "user entity" can refer to a machine, device, component, hardware, software, smart device and/or human.

As used herein, "coupler", "coupler element", and "coupling element" can be interchangeable.

In the following description, for purposes of explanation, numerous specific details are set forth in order to provide a more thorough understanding of the one or more embodiments. It is evident, however, in various cases, that the one or more embodiments can be practiced without these specific details.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 of FIG. 1, can further comprise, be associated with, and/or be coupled to one or more computer and/or computing-based elements described herein with reference to an operating environment, such as the operating environment 1300 illustrated at FIG. 13. In one or more described embodiments, computer and/or computing-based elements can be used in connection with implementing one or more of the systems, devices, components and/or computer-implemented operations shown and/or described in connection with FIG. 1 and/or with other figures described herein.

Turning first generally to FIG. 1, one or more embodiments described herein can include one or more electronic devices, systems and/or apparatuses that can provide a process to execute one or more quantum operations, such as perform one or more quantum gates. At FIG. 1, illustrated is a block diagram of an example, non-limiting system 100 that can provide such probing process, in accordance with one or more embodiments described herein. While referring here to one or more processes, facilitations and/or uses of the non-limiting system 100, description provided herein, both above and below, also can be relevant to one or more other non-limiting systems described herein, such as the devices/systems of FIGS. 2, 4 and/or 8-10, to be described below in detail.

The following/aforementioned description(s) refer(s) to the operation of a single quantum program from a single quantum job request. This operation can include one or more readouts from cryogenic environment electronics within cryogenic chamber 116 by room temperature control/readout electronics 112 external to the cryogenic chamber 116. That is, one or more of the processes described herein can be scalable, also such as including additionally, and/or alternatively, execution of one or more quantum programs and/or quantum job requests in parallel with one another. Scalability of efficient readout can be enabled by employing semiconductor devices 111 in quantity.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an advanced and adaptive network technology (ANT), an ultra-wideband (UWB) standard protocol and/or other proprietary and/or non-proprietary communication protocols.

In one or more other embodiments, the classical system can provide a quantum job request 104, qubit mapping, quantum circuit to be executed and/or the like. Such classical system can analyze the one or more quantum measurement readouts 120. Further, such classical system can manage a queueing of quantum circuits to be operated on the one or more qubits of the quantum logic circuit of a respective quantum system 101.

Figure 13:
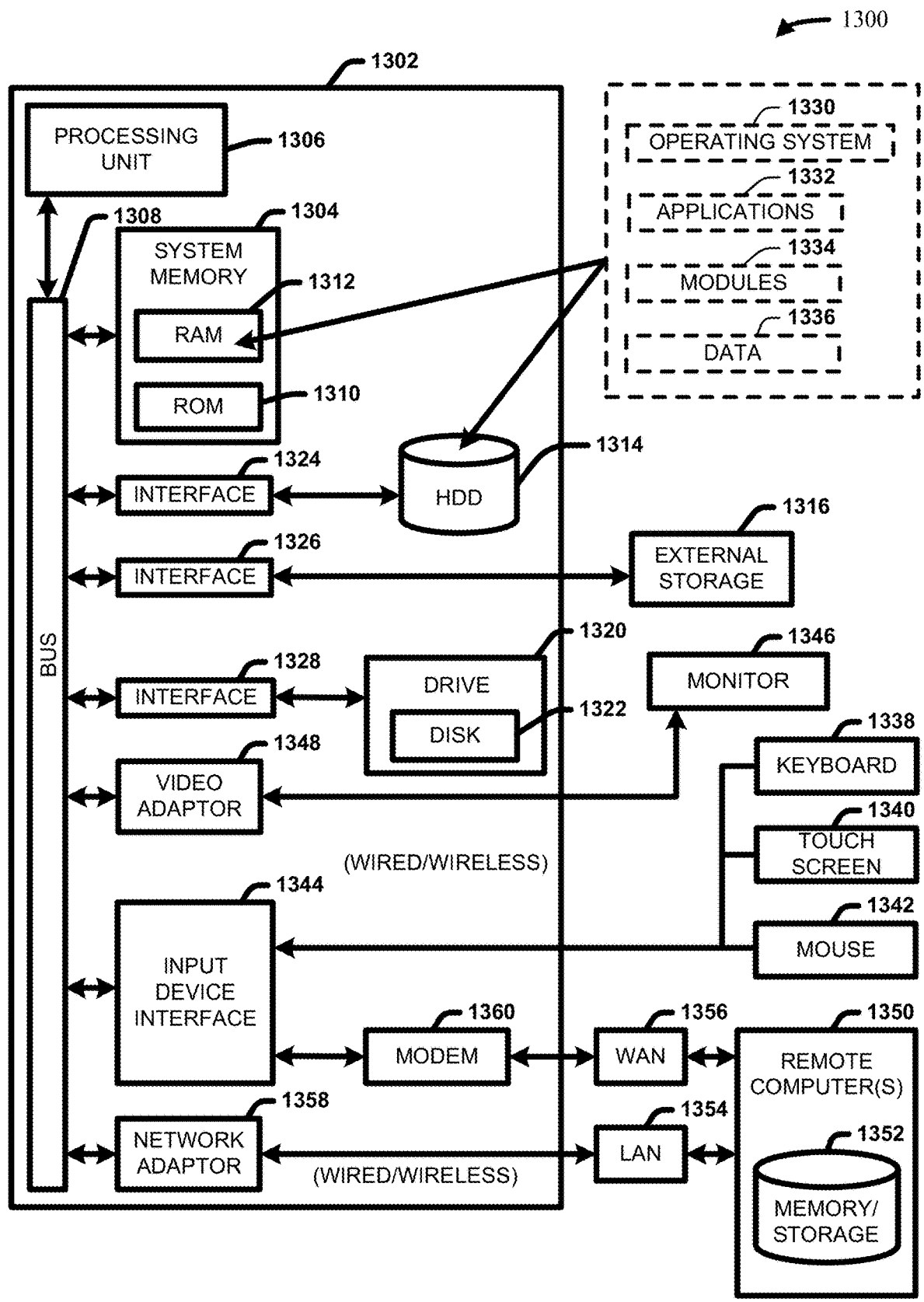
FIG. 13 illustrates a block diagram of an example, non-limiting, operating environment in which one or more embodiments described herein can be provided.

For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 1300 illustrated at FIG. 13. In one or more described embodiments, computer and/or computing-based elements can be used in connection with implementing one or more of the systems, devices, components and/or computer-implemented operations shown and/or described in connection with FIG. 1 and/or with other figures described herein.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum processor 106, quantum readout/control electronics 112, a waveform generator 110, and/or a quantum logic circuit 108 comprising one or more qubits (e.g., qubits 107A, 107B and/or 107C), also referred to herein as qubit devices 107A, 107B and 107C.

The quantum processor 106 can be any suitable processor. The quantum processor 106 can generate one or more instructions for controlling the one or more processes of the quantum logic circuit 108 and/or waveform generator 110.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more waveform operations for operating and/or affecting one or more quantum circuits on the one or more qubits 107A, 107B and/or 107C. For example, the waveform generator 110 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101.

The waveform generator 110 can comprise one or more semiconductor devices 111 having a respective closely co-integrated resonant tunneling diode (RTD) and field effect transistor (FET). This co-integration can provide for flow along a respective substrate or base surface (e.g., where the substrate is removed from, if the substrate is removed) between the RTD and FET.

Employing the semiconductor device 111, such as a semiconductor chip, the waveform generator 110 can generate a qubit control pulse employing low power, such as less than 1 milliwatt per qubit (mW/qubit). In quantity, the power employed by such semiconductor devices can more readily be cooled by a cooling system (e.g., dissipated), such as inside a respective cryogenic chamber.

The waveform generator 110, such as in combination with the quantum processor 106, can execute operation of a quantum logic circuit on one or more qubits of the circuit (e.g., qubit 107A, 107B and/or 107C). In response, the quantum operation component 103 can output one or more quantum job results, such as one or more quantum measurements 120, in response to the quantum job request 104.

The quantum logic circuit 108 and a portion or all of the waveform generator 110 and/or quantum processor 106 can be contained in a cryogenic environment, such as generated by a cryogenic chamber 116, such as a dilution refrigerator. The semiconductor device 111 can thus be employed in a cryogenic environment. Indeed, a signal can be generated by the waveform generator 110 to affect the one or more qubits 107A-C. Where qubits 107A, 107B and 107C are superconducting qubits, cryogenic temperatures, such as about 4 Kelvin (K) or lower can be employed to facilitate function of these physical qubits. Accordingly, the elements of the waveform generator 110, including the semiconductor device 111, also are to be constructed to perform at such cryogenic temperatures.

Turning now to additional FIGS. 2-12, varying embodiments of devices/systems than can be employed, where applicable as at least a portion of the quantum processor 106 or the quantum logic circuit 108 are described herein. For example, FIG. 2 and each of 4-10 illustrate, at least schematically, or with a block diagram, an electronic device that can be employed as a at least a portion of the quantum processor 106 or quantum logic circuit 108 as illustrated at FIG. 1. Although, descriptions of the aspects of FIGS. 2-12 can stand on their own, separate from any connection, implied, direct or otherwise, to the aspects of FIG. 1.

Figure 2:
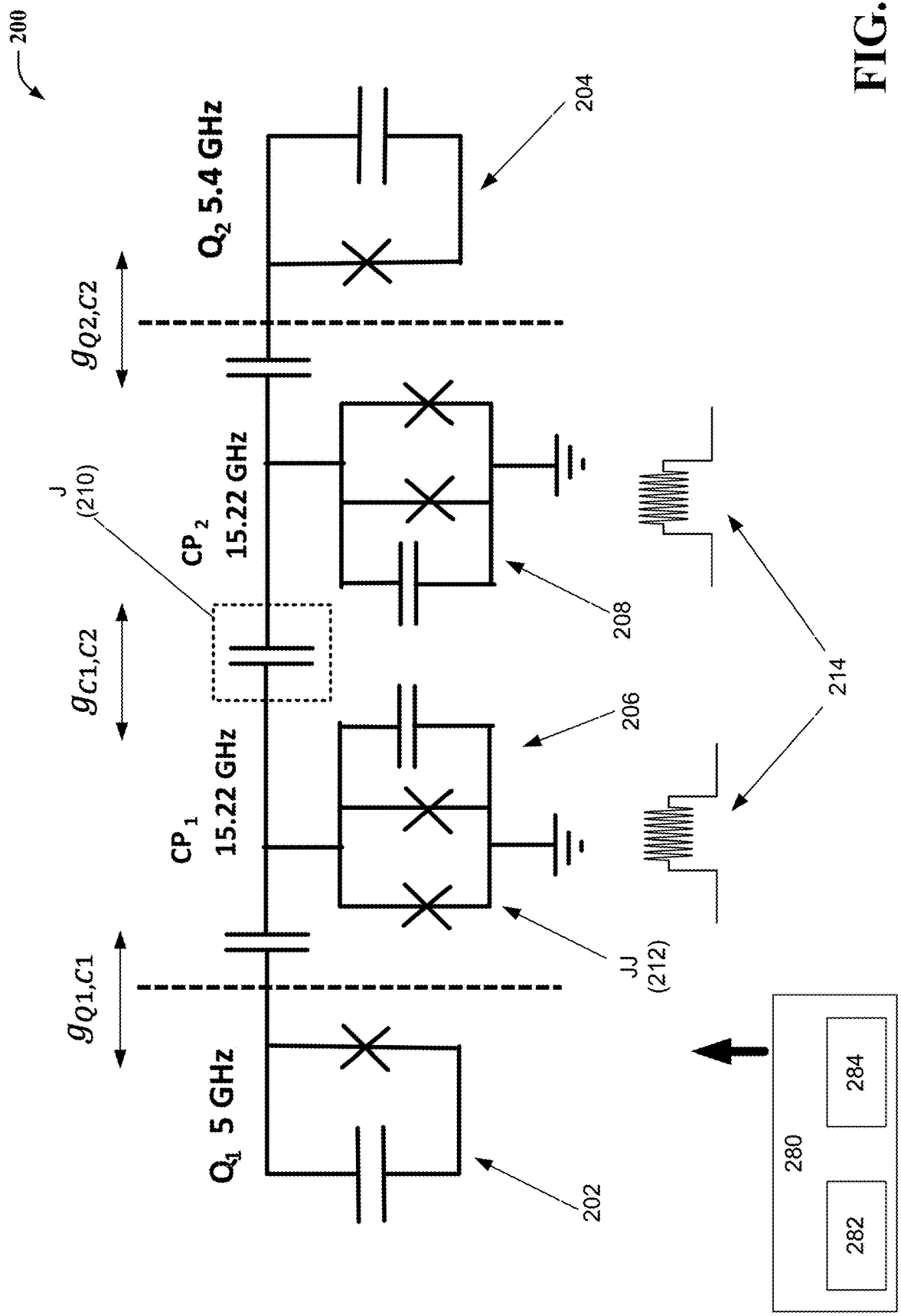
FIG. 2 illustrates a schematic view of an electronic device embodiment, which embodiment can be employed in the quantum system of FIG. 1, in accordance with one or more embodiments described herein.

FIG. 2 illustrates a schematic view of a device 200 having a first qubit Q1 (202), a second qubit Q2 (204) and a plurality of couplers CP1 (206) and CP2 (208). The first and second qubits 202/204 are coupled to one another by the plurality of couplers 206/208, also herein referred to as coupling elements or coupler elements. The plurality of couplers 206/208 are coupled to one another by a junction J (210). In the illustrated embodiment, the junction 210 comprises a capacitor. A capacitor also is coupled between the first qubit 202 and the first coupler 206, and between the second qubit 204 and the second coupler 208.

Each of the couplers 206 and 208 can be tunable, such as being a tunable superconducting quantum interference device (SQUID) or direct current (DC) SQUID. Each can comprise a Josephson junction JJ (212). Each SQUID 206, 208 can be biased by a biasing element 214. As used herein, a "tunable" coupler can refer to any coupler in which the frequency of the coupler changes due to current flowing through a nearby biasing element.

Generally, the couplers 206 and 208 can be thought of as access devices that can be biased and driven to allow for active coupling of the qubits that the couplers are physically connecting together. That is, a coupler associated with each qubit (e.g., coupler 206 with qubit 202 and coupler 208 with qubit 204) can be activated by applying a bias with drive at a difference frequency of the respective qubits superimposed being applied at the couplers between selected qubits. Differently, the drive can be at the difference frequency with an additional positive/negative anharmonicity. As used herein, the difference frequency can be the absolute difference between the resonant frequencies of the qubits at rest (state 0).

The drive can be sinusoidal/parametric, rectangular, baseband and/or otherwise. Use of sinusoidal pulses can have an advantage where the frequency applied can allow for discrimination between pairs of couplers, to be further described below. Activation of each of the two respective couplers can allow for operation between only the qubits connected by the couplers, such as where excitation can transfer between the qubits.

Figure 3:
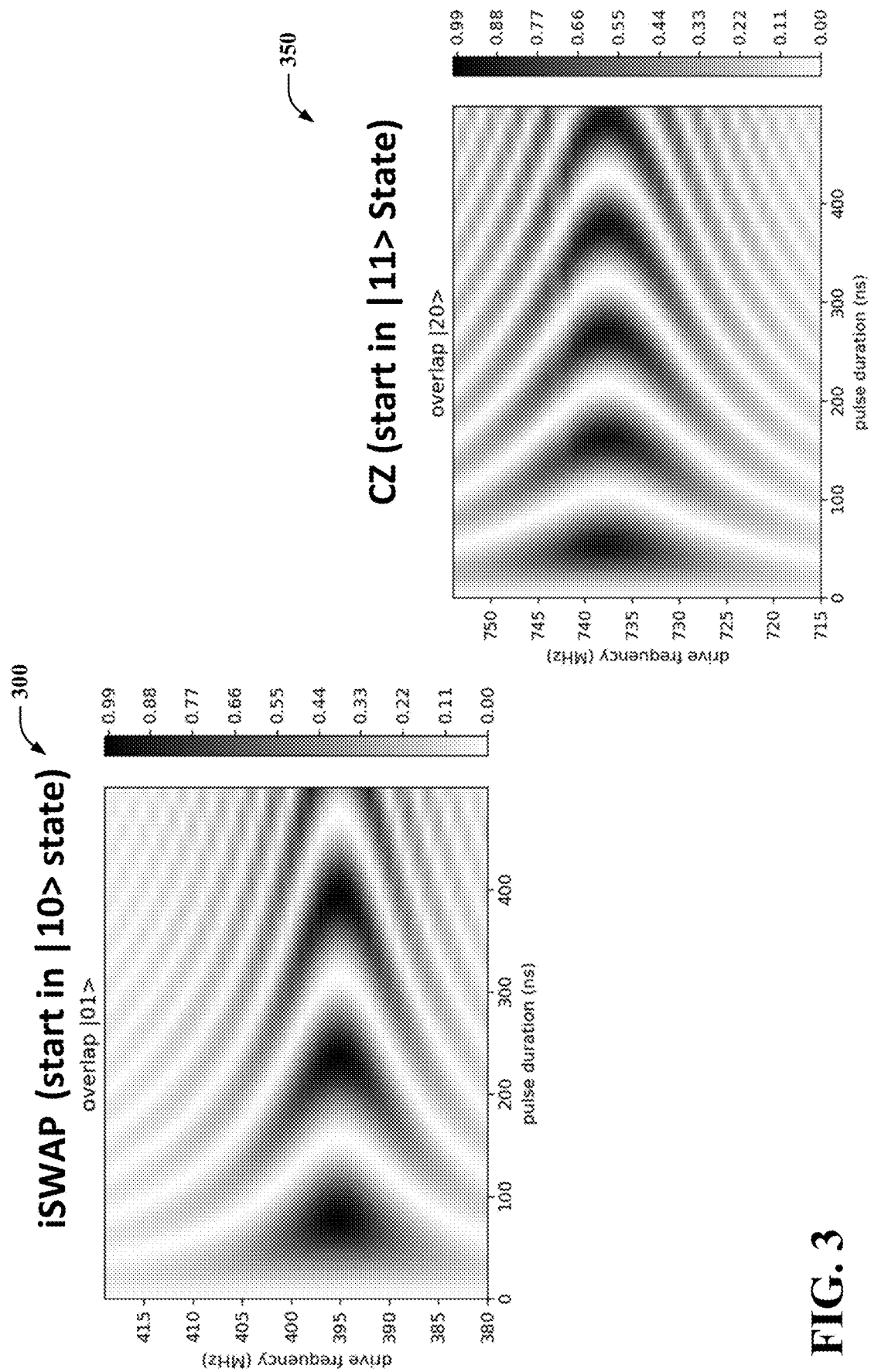
FIG. 3 illustrates a pair of plots demonstrating simulation of execution of different quantum gates employing the electronic device of FIG. 2, in accordance with one or more embodiments described herein.

For example, an entangle swapping gate where qubits obtain a phase of I if the state of the qubits is swapped (iSWAP gate) can be performed with the qubits 202 and 204 where one of the qubits starts at an excited state, and by applying a bias and then operating a drive, such as a parametric drive, at the difference frequency to each of the couplers 206 and 208. A simulation of this operation is illustrated at FIG. 3, plot 300 relative to the device 200 having a qubit Q1 (202) at 5 gigahertz (GHz), a qubit Q2 (204) at 5.4 GHz, a difference frequency of 0.4 GHz, a coupler CP1 (206) operating at 15.22 GHz (at 0 flux bias), a coupler CP2 (202) operating at 15.22 GHz (at 0 flux bias).

It is noted that the two couplers each operate at the same frequency. It also is noted that the Josephson junctions 212 of the couplers 206 and 208 can be larger than conventionally employed SQUID JJ's.

Turning specifically to plot 300, as shown, drive frequency is at about 395 megahertz (MHz). Plot 300 illustrates results of a simulation where qubit Q1 starts in the excited state and qubit Q2 starts in the state 110>. A flux bias and sinusoidal drive frequency at the difference frequency of both qubits ~395 MHz is simultaneously applied to the couplers attached to Q1 and Q2. A chevron pattern is observed where oscillations are observed between the |10> and |01> states as a function of flux pulse length and frequency.

A scale of the plot 300 illustrates overlap of the quantum state <\psi| of the two qubits vs. time with the state |01> of the two qubits (the ordering of the qubits in the tens product is Q1 followed by Q2). That is, <\psi| changes with respect to time. The overlap is given by |<\psi|01>|².

Turning away from plot 300 and instead to plot 350, in another example, a controlled-Z (CZ gate), which is a two-qubit gate, can be performed with the qubits 202 and 204 where both qubits start in an excited state, and by applying a bias and then operating a drive, such as a parametric drive, at the difference frequency to each of the couplers 206 and 208, and the difference frequency applied at each respective being modified by the anharmonicity. As used herein, anharmonicity is a property of qubits and of couplers. When the CZ gate is applied, and both qubits 202 and 204 are in the excited state, the parametric drive at the different frequency +/− the anharmonicity of the qubits 202 and 204 is applied to the couplers 206 and 208, to thereby activate the couplers 206 and 208 for the CZ gate execution. Anharmonicity of the couplers 206 and 208 does not factor into this activation.

A simulation of this operation is illustrated at FIG. 3, plot 350 relative to the device 200 having the same values as above, with the anharmonicity of the qubits Q1/Q2 of −0.6648 GHz applied to each of the two couplers 206 and 208. At plot 350, as shown, drive frequency is at about 738 MHz. Plot 350 illustrates results similar to those of plot 300, where qubits Q1 and Q2 both start in the excited state. Oscillations are observed between the |11> state and |20> state.

A scale of the plot 350 illustrates overlap of the quantum state <\psi| of the two qubits vs. time with the state |20> of the two qubits (the ordering of the qubits in the tensor product is Q1 followed by Q2). That is, <\psi| changes with respect to time. The overlap is given by |<\psi|20>|².

For the simulations resulting in the graphs of FIG. 3, a Hamiltonian simulation was employed where the qubits and couplers were treated as Duffing oscillators using Equation 1.

$$H_m = \omega_m \hat{a}_m^\dagger \hat{a}_m + \frac{\alpha_m}{2} \hat{a}_m^\dagger \hat{a}_m^\dagger \hat{a}_m \hat{a}_m.$$ Equation 1

Equation 2 represents the coupling of the qubits to the couplers and the coupling of the couplers to each other.

$$H_{i,j} = -g_{i,j}(\hat{a}_i - \hat{a}_i^\dagger)(\hat{a}_j - \hat{a}_j^\dagger).$$ Equation 2:

Equation 3 represents a direct coupling term for the nearest neighbor circuit elements only.

$$g_{i,j} = \frac{1}{2} \frac{C_{i,j}}{\sqrt{C_i C_j}} \sqrt{\omega_i \omega_j}.$$ Equation 3

Figure 4:
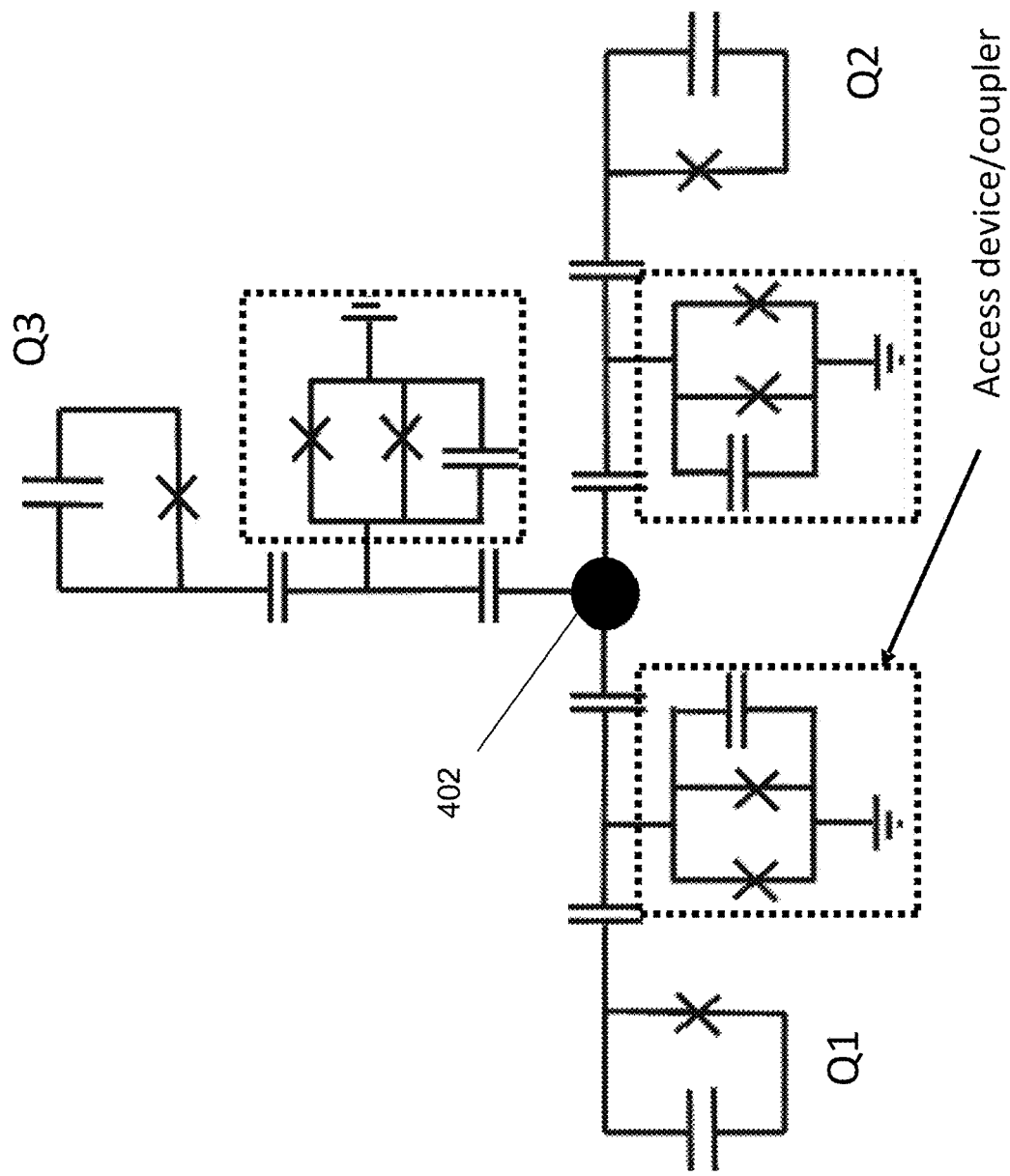
FIG. 4 illustrates a block diagram of another electronic device embodiment, which embodiment can be employed in the quantum system of FIG. 1, in accordance with one or more embodiments described herein.

Turning now to FIG. 4, illustrated is another electronic device 400 in accordance with the embodiments described herein. Electronic device 400 is similar to electronic device 200, but employs a node-type junction 402 and three qubits Q1, Q2 and Q3 with three separate couplers. Capacitors are employed between each qubit and coupler pair, and between each coupler and the node junction 402. By the electronic device 400, each qubit Q1, Q2 and Q3 is individually and separately coupled to the junction 402 by a separate, respective coupler. Put another way, the junction 402 provides the only coupling between the qubits, where the qubits are not otherwise coupled to one another other than by the junction 402. That is, all couplers are coupled to all other couplers by the junction 402.

Figure 5:
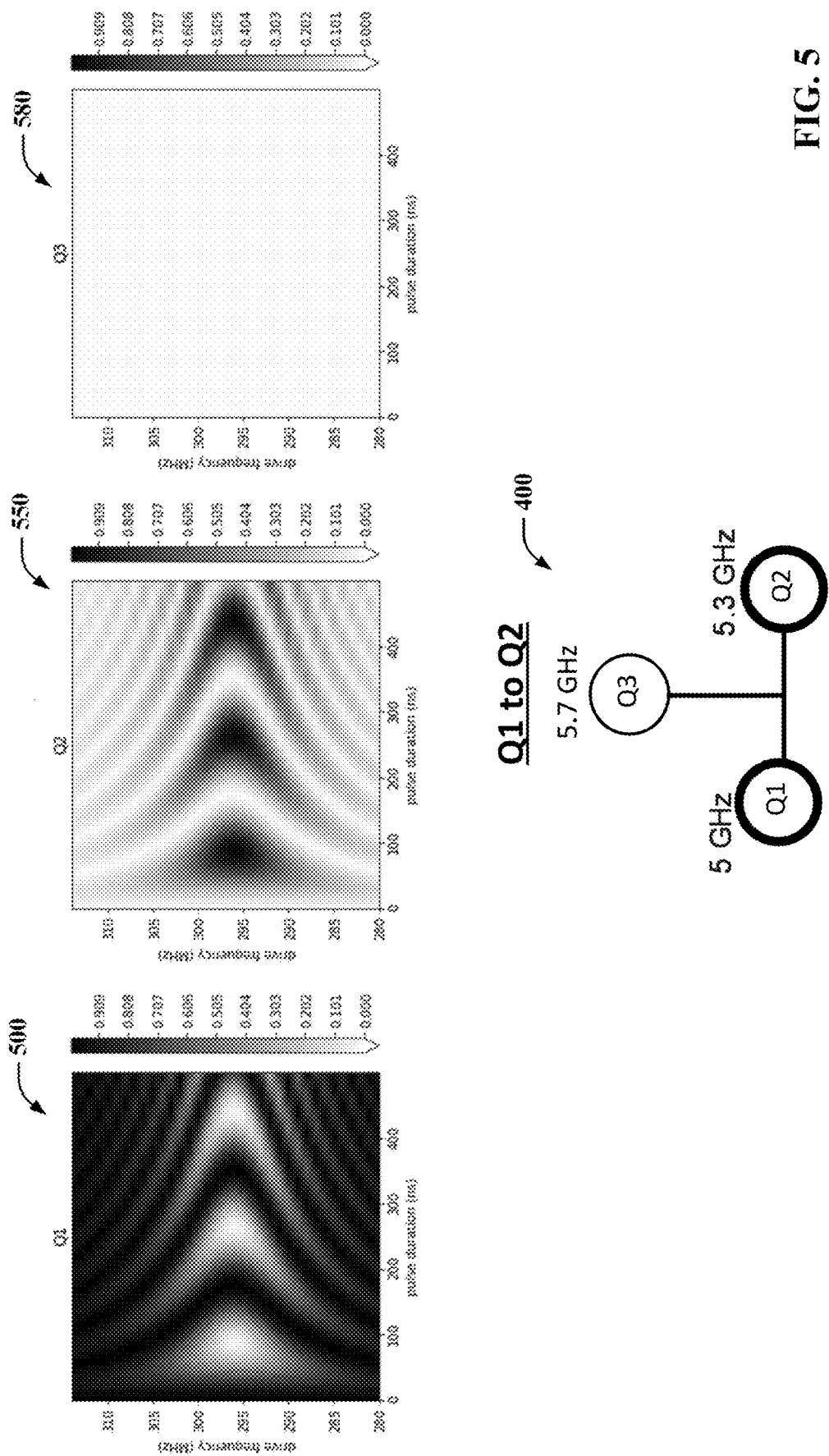
FIG. 5 illustrates a trio of plots demonstrating simulation of execution of a quantum iSWAP gate employing qubits 1 and 2 of the electronic device of FIG. 4, in accordance with one or more embodiments described herein.
Figure 6:
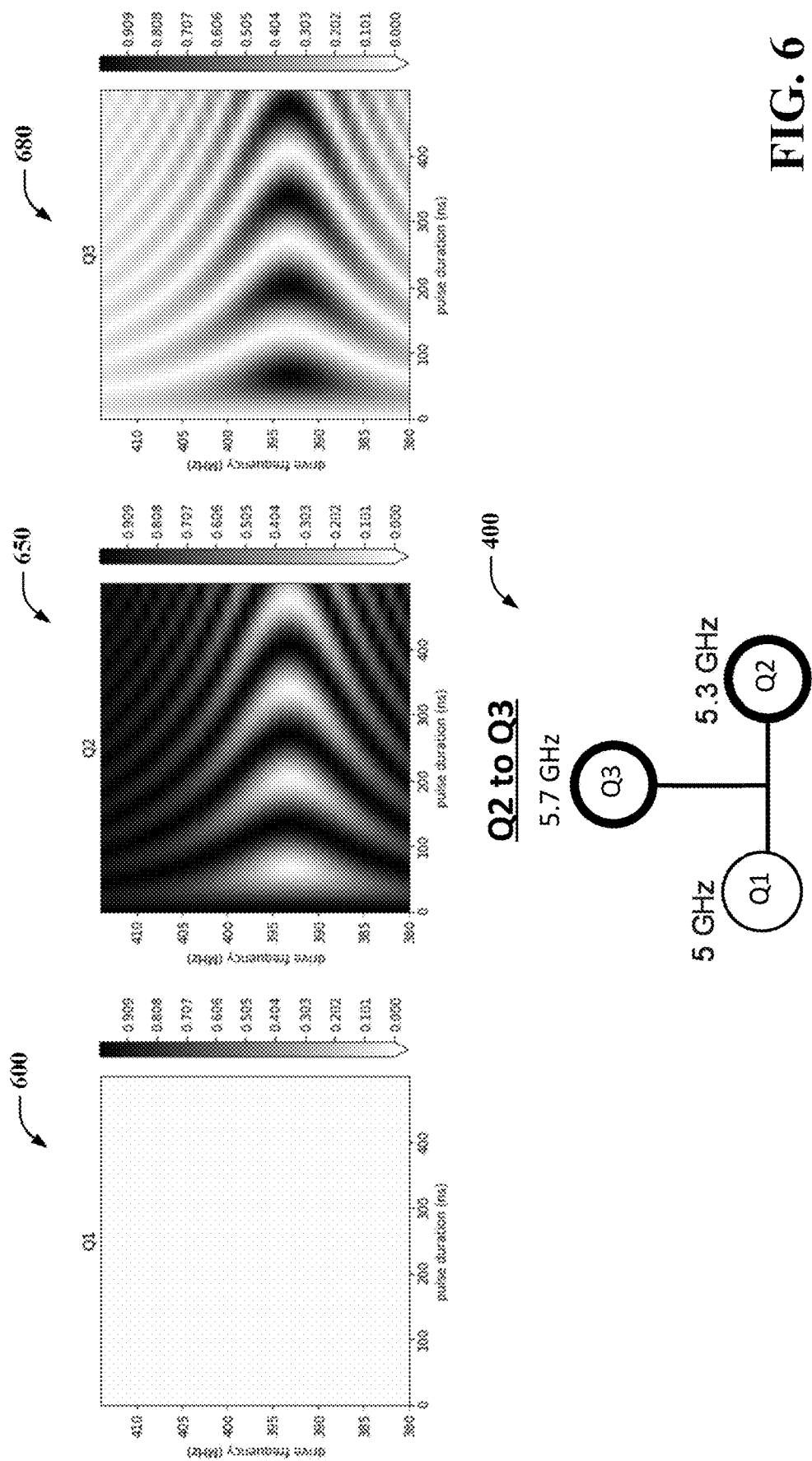
FIG. 6 illustrates a trio of plots demonstrating simulation of execution of a quantum iSWAP gate employing qubits 2 and 3 of the electronic device of FIG. 4, in accordance with one or more embodiments described herein.
Figure 7:
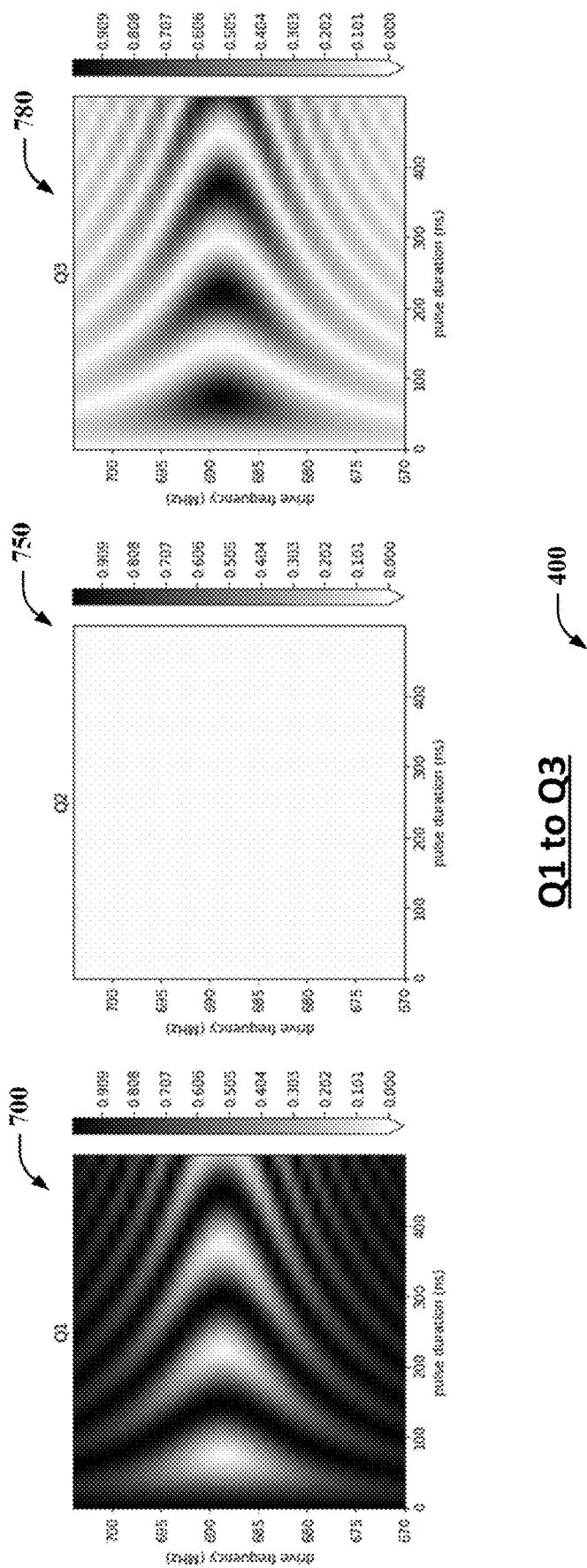
FIG. 7 illustrates a trio of plots demonstrating simulation of execution of a quantum iSWAP gate employing qubits 1 and 3 of the electronic device of FIG. 4, in accordance with one or more embodiments described herein.
Figure 7:
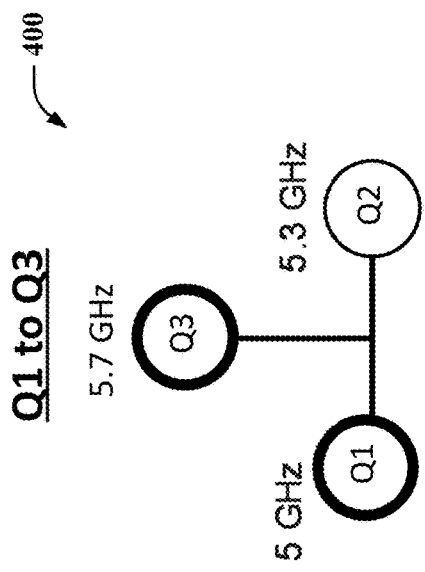

Turning now to FIGS. 5-7, illustrated are plots of simulations of execution of iSWAP gates employing the electronic device 400 of FIG. 4, in accordance with one or more embodiments described herein. In each of the FIGS. 5-7, Q1 has a resonant frequency of 5 GHz, Q2 has a resonant frequency of 5.3 GHz, and Q3 has a resonant frequency of 5.7 GHz. The qubits Q1, Q2 and Q3 are capacitively coupled to one another by the node 402.

The bias information at the top of FIGS. 5 to 7 is the DC offset (e.g., 214) that is applied to the couplers while the parametric drive is applied (e.g., generally the rectangular pulse the sinusoidal pulse sits on, referred to as 214). Notably, the bias 214 is non-zero.

Turning first to FIG. 5, illustrated is a set of three graphs demonstrating simulation of execution of an iSWAP gate employing qubits Q1 and Q2 of the electronic device 400 of FIG. 4. The set of three plots 500, 550 and 580 illustrates the drive frequency and pulse duration of each qubit separately. The right hand side of each plot 500, 550 and 580 shows the population in the respective qubit as a function of parametric drive frequency and pulse duration. In FIG. 5, population is transferred between Q1 and Q2, which corresponds to the difference frequency of both qubits.

Turning next to FIG. 6, illustrated is a set of three graphs demonstrating simulation of execution of an iSWAP gate employing qubits Q2 and Q3 of the electronic device 400 of FIG. 4. The set of three plots 600, 650 and 680 illustrates the drive frequency and pulse duration of each qubit separately. The right hand side of each plot 600, 650 and 680 shows the population in the respective qubit as a function of parametric drive frequency and pulse duration. In FIG. 6, population is transferred between Q2 and Q3, which corresponds to the difference frequency of both qubits.

Turning now to FIG. 7, illustrated is a set of three graphs demonstrating simulation of execution of an iSWAP gate employing qubits Q1 and Q3 of the electronic device 400 of FIG. 4. The set of three plots 700, 750 and 780 illustrates the drive frequency and pulse duration of each qubit separately. The right hand side of each plot 700, 750 and 780 shows the population in the respective qubit as a function of parametric drive frequency and pulse duration. In FIG. 7, population is transferred between Q1 and Q3, which corresponds to the difference frequency of both qubits.

It is noted that, relative to FIGS. 5-7, inductive coupling of the qubits, rather than capacitive coupling as simulated, would show the same results as illustrated because the qubits would function having the same underlying Hamiltonian (underlying physics description). The implementation in terms of a circuit would be different, but physics would appear the same, and thus FIGS. 5-7 also are representative of inductive coupling simulations.

Figure 8:
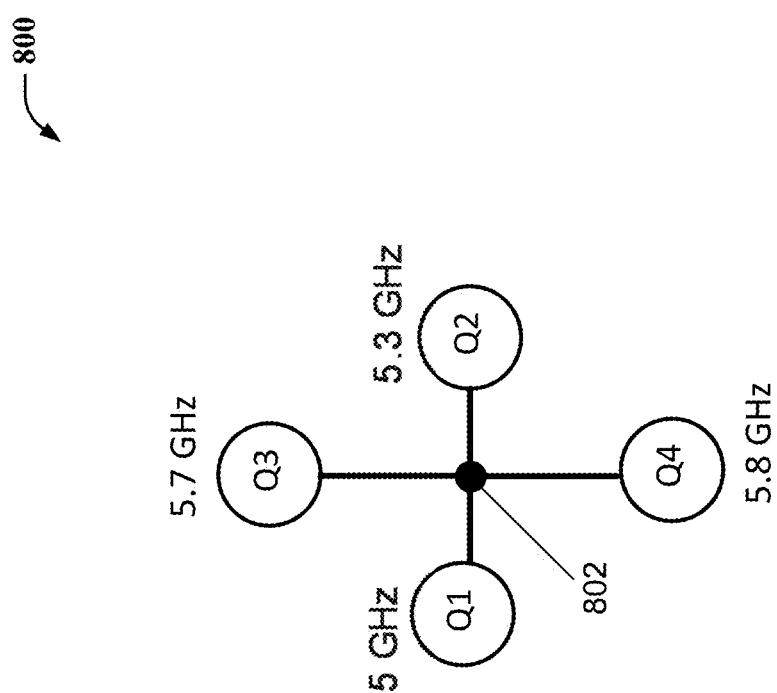
FIG. 8 illustrates a block diagram of yet another electronic device embodiment, which embodiment can be employed in the quantum system of FIG. 1, in accordance with one or more embodiments described herein.

Turning now to FIG. 8, illustrated is another electronic device 800, in accordance with one or more embodiments described herein. The electronic device 800 is similar to the electronic device 400, but includes four qubits instead of the three qubits of the electronic device 400. Q1 has a resonant frequency of 5 GHz, Q2 has a resonant frequency of 5.3 GHz, Q3 has a resonant frequency of 5.7 GHz, and Q4 has a resonant frequency of 5.8 GHz. All four qubits are individually coupled to respective couplers (not shown) and are ultimately coupled only to one another by the junction 802. That is, all couplers are coupled to all other couplers by the junction 802.

By use of a parametric drive, applied at a difference frequency between selected pairs of qubits, parallel high connectivity operations can be employed at the same time using the device 800. For example, a parametric gate can be operated using two of the qubits, where a second parametric gate can be operated using the other two of the qubits. With the parametric/sinusoidal pulses, the frequency applied can allow for discrimination between pairs of qubits, allowing for the parallelly-performed operations.

Figure 9:
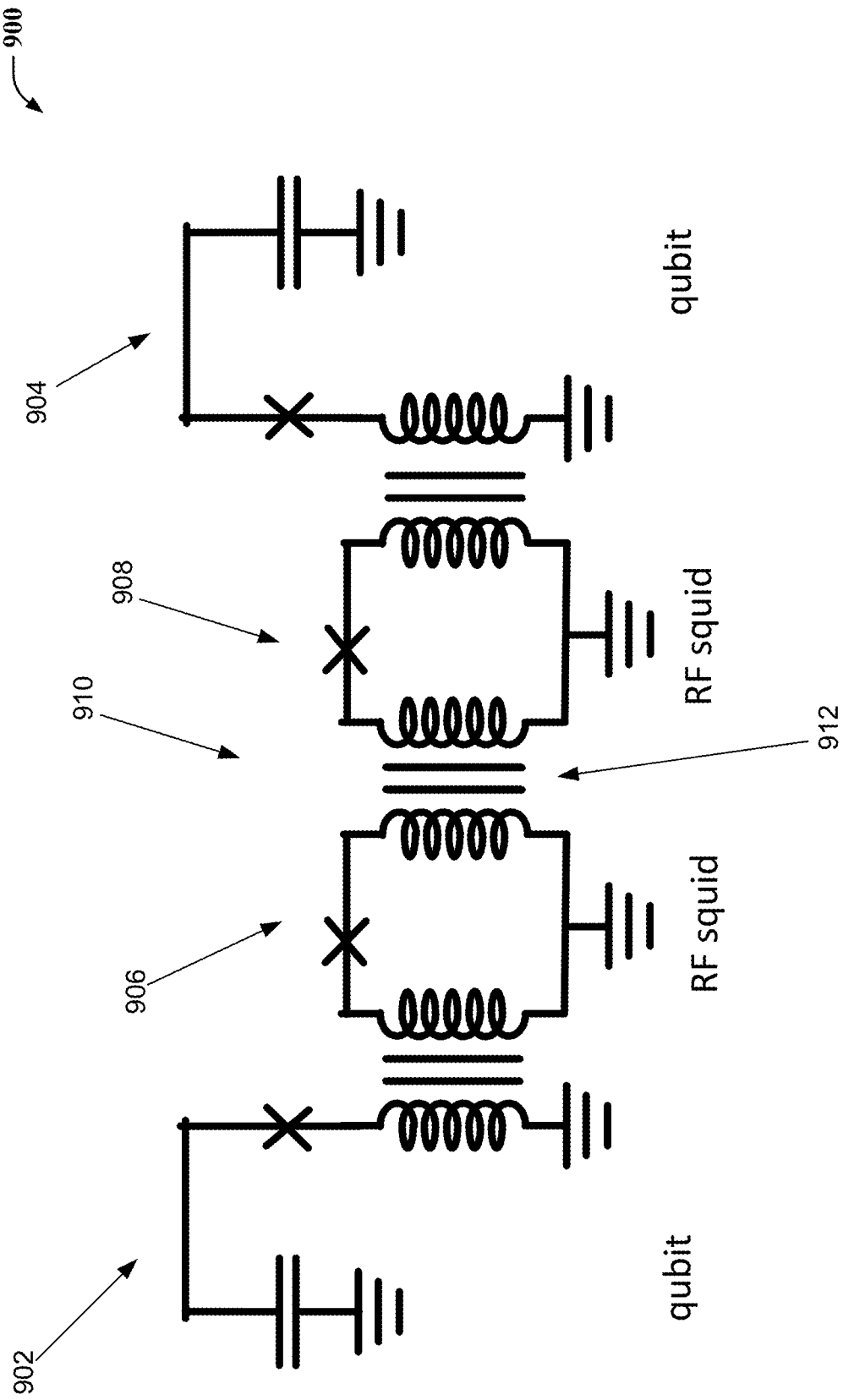
FIG. 9 illustrates a block diagram of still another electronic device embodiment, which embodiment can be employed in the quantum system of FIG. 1, in accordance with one or more embodiments described herein.
Figure 10:
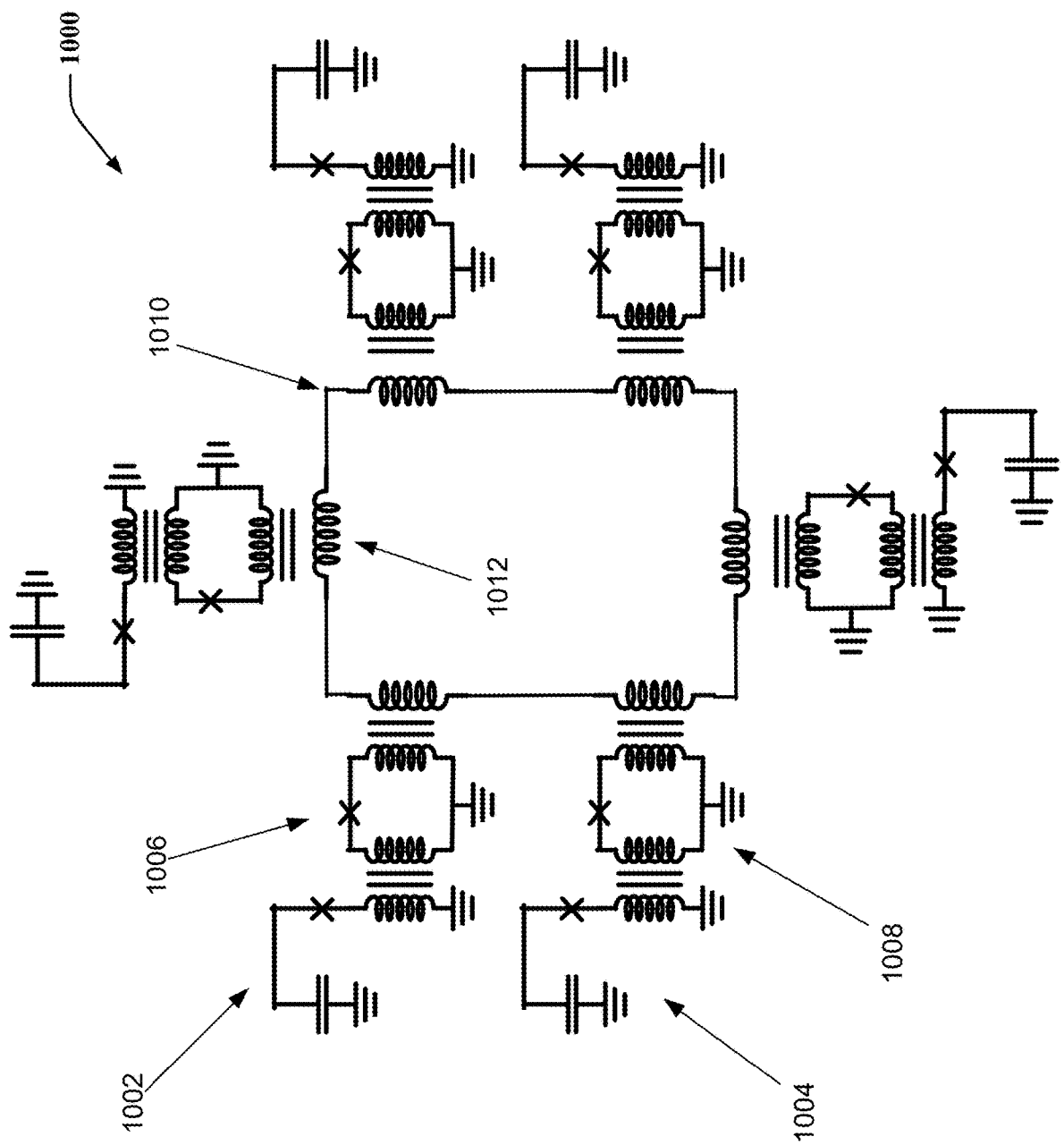
FIG. 10 illustrates a block diagram of another electronic device embodiment, which embodiment can be employed in the quantum system of FIG. 1, in accordance with one or more embodiments described herein.

Turning now to FIGS. 9 and 10, inductive coupling of qubits is depicted, as compared to the capacitive coupling at FIGS. 2-4. The inductive coupling is similar to the capacitive coupling, and also employs a junction coupling together couplers that are individually coupled to respective qubits. It is noted that at FIGS. 9 and 10, the inductive coupling can be galvanic or non-galvanic.

Turning now to FIG. 9, illustrated is another electronic device 900, in accordance with one or more embodiments described herein. The device 900 comprises a first qubit 902, a tunable first coupler 906, a second qubit 904, and a tunable second coupler 908. A junction 910, can be comprised in the electronic device 900 by portions of each of the couplers 906 and 908. In another way, the biasing element 912 between the couplers 906 and 908 can be considered as the junction 910. Each coupler 906, 908 can comprise a radio frequency (RF) SQUID, such as each having a 14 GHz to 15 GHz resonant frequency.

An iSWAP gate can be performed with the qubits 902 and 904 where one of the qubits starts at an excited state, and by applying a bias and then operating a drive, such as a parametric drive, at the difference frequency to each of the couplers 906 and 908.

In another example, a CZ gate can be performed with the qubits 902 and 904 where both qubits start in an excited state, and by applying a bias and then operating a drive, such as a parametric drive, at the difference frequency to each of the couplers 906 and 908, with the +/− anharmonicity of the qubits.

Turning now to FIG. 10, illustrated is another electronic device 1000, in accordance with one or more embodiments described herein. The electronic device 1000 comprises a plurality of qubits, including qubits 1002 and 1004, and a plurality of couplers, including couplers 1006 and 1008. Each qubit is inductively coupled, individually, to a separate and respective coupler. Each coupler is inductively coupled to all other couplers by the junction 1010. The junction 1010 comprises a loop including a plurality of series-connected inductors 1012. One inductor 1012 is included for each coupler. That is there are individual inductor 1012/coupler pairs.

An iSWAP gate can be performed with a pair of the plurality of qubits, such as qubits 1002 and 1004, where one of the qubits starts at an excited state, and by applying a bias and then operating a drive, such as a parametric drive, at the difference frequency to each of the couplers 1006 and 1008.

The inductors 1012 can be discriminated by choosing the qubits desired to be coupled together to perform an entire operation. In one or more embodiments, the loop junction 1010 can be non-fully-activated. Rather only two qubits at a time are activated by the respective portions of the loop junction 1010. The discrimination is through selection of qubits, applying a separate qubit bias to those qubits and applying a signal at the appropriate frequency difference between the two qubits.

In another example, a CZ gate can be performed with a pair of the plurality of qubits, such as qubits 1002 and 1004, where both qubits start in an excited state, and by applying a bias and then operating a drive, such as a parametric drive, at the difference frequency to each of the couplers 1006 and 1008, with the +/− anharmonicity of the qubits.

Turning next again, briefly, to FIG. 2, in one or more embodiments, an entity 280 can perform one or more operations to manufacture an electronic device and/or system that is in accordance with one or more embodiments described herein. For example, an entity 280, such as a manufacturing system, can comprise a controller and/or processor 282. The processor 282 can issue one or more instructions to cause manufacture of the electronic device and/or system. For example, the entity 280 further can comprise one or more nodes 284, such as manufacturing devices, that can be controlled by the controller 282 to manufacture the electronic device and/or system. In an example, a node 284 can be controlled to couple a coupler element to a qubit chip, and/or the like.

In one or more embodiments, the entity 280, and/or another manufacturing entity, can perform one or more operations (e.g., manufacturing operations) corresponding to one or more electronic devices and/or systems described herein.

Figure 11:
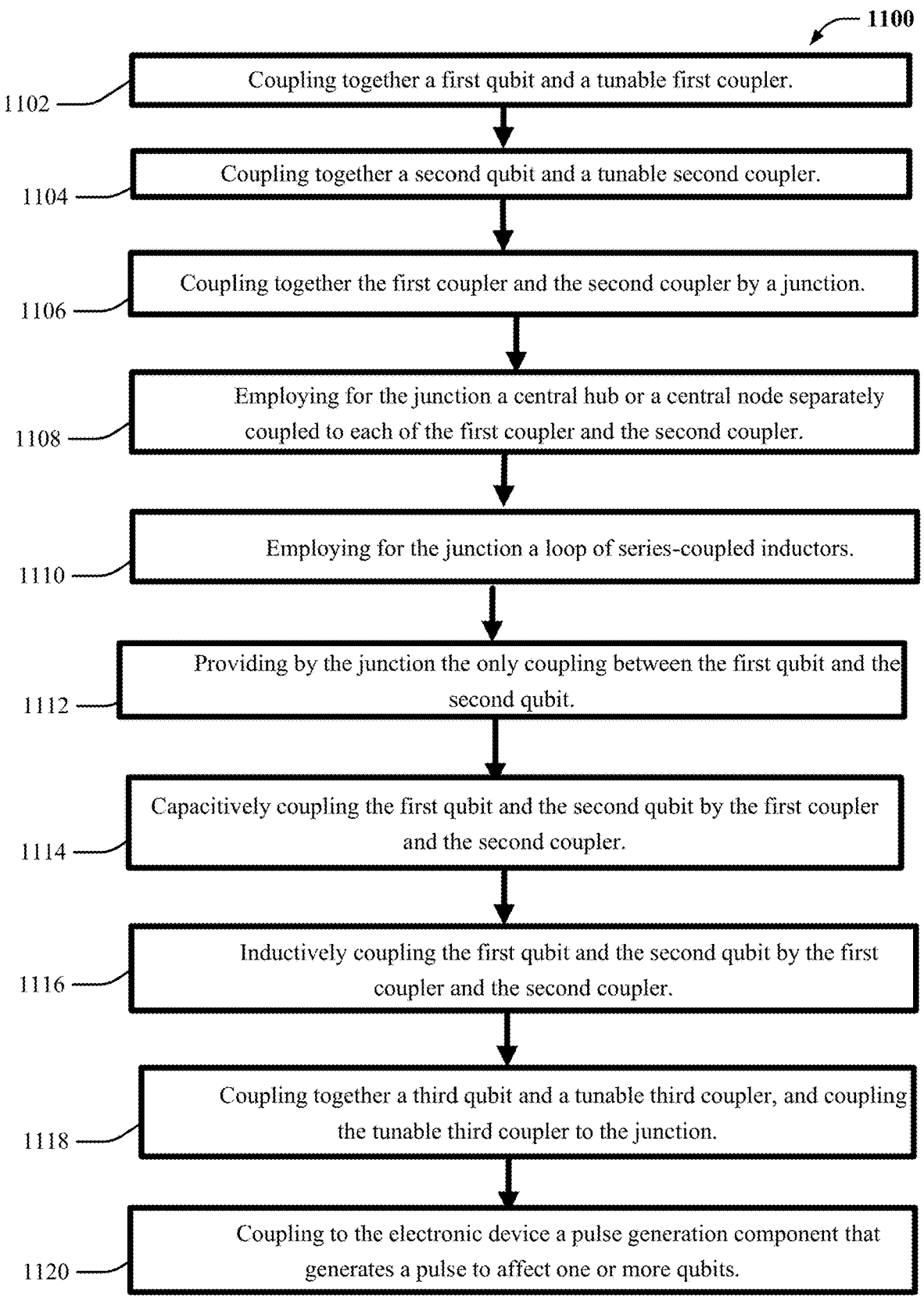
FIG. 11 illustrates a process flow for a method of manufacture of an electronic device in accordance with one or more embodiments described herein.

Next, FIG. 11 illustrates a flow diagram of an example, non-limiting method 1100 that can provide a process to at least partially construct an electronic device in accordance with one or more embodiments described herein, such as the non-limiting devices of FIGS. 1, 2, 4 and/or 8-10. Repetitive description of like elements and/or processes employed in respective embodiments is omitted for sake of brevity.

At 1102, the non-limiting method 1100 can comprise coupling together (e.g., by an entity 280) a first qubit and a tunable first coupler.

At 1104, the non-limiting method 1100 can comprise coupling together (e.g., by an entity 280) a second qubit and a tunable second coupler.

At 1106, the non-limiting method 1100 can comprise coupling together (e.g., by an entity 280) the first coupler and the second coupler by a junction.

At 1108, the non-limiting method 1100 can comprise employing for the junction (e.g., by an entity 280) a central hub or a central node separately coupled to the first coupler and the second coupler.

At 1110, the non-limiting method 1100 can comprise employing for the junction (e.g., by an entity 280) a loop of series-coupled inductors.

At 1112, the non-limiting method 1100 can comprise providing by the junction (e.g., junction 210, 402, 802, 912 and/or 1010) the only coupling between the first qubit and the second qubit.

At 1114, the non-limiting method 1100 can comprise capacitively coupling (e.g., by an entity 280) the first qubit and the second qubit by the first coupler and the second coupler.

At 1116, the non-limiting method 1100 can comprise inductively coupling (e.g., by an entity 280) the first qubit and the second qubit by the first coupler and the second coupler.

At 1118, the non-limiting method 1100 can comprise coupling together (e.g., by an entity 280) a third qubit and a tunable third coupler, and coupling (e.g., by an entity 280) the tunable third coupler to the junction.

At 1120, the non-limiting method 1100 can comprise further coupling to the electronic device (e.g., by an entity 280) a pulse generation component that generates a pulse to affect one or more qubits.

Figure 12:
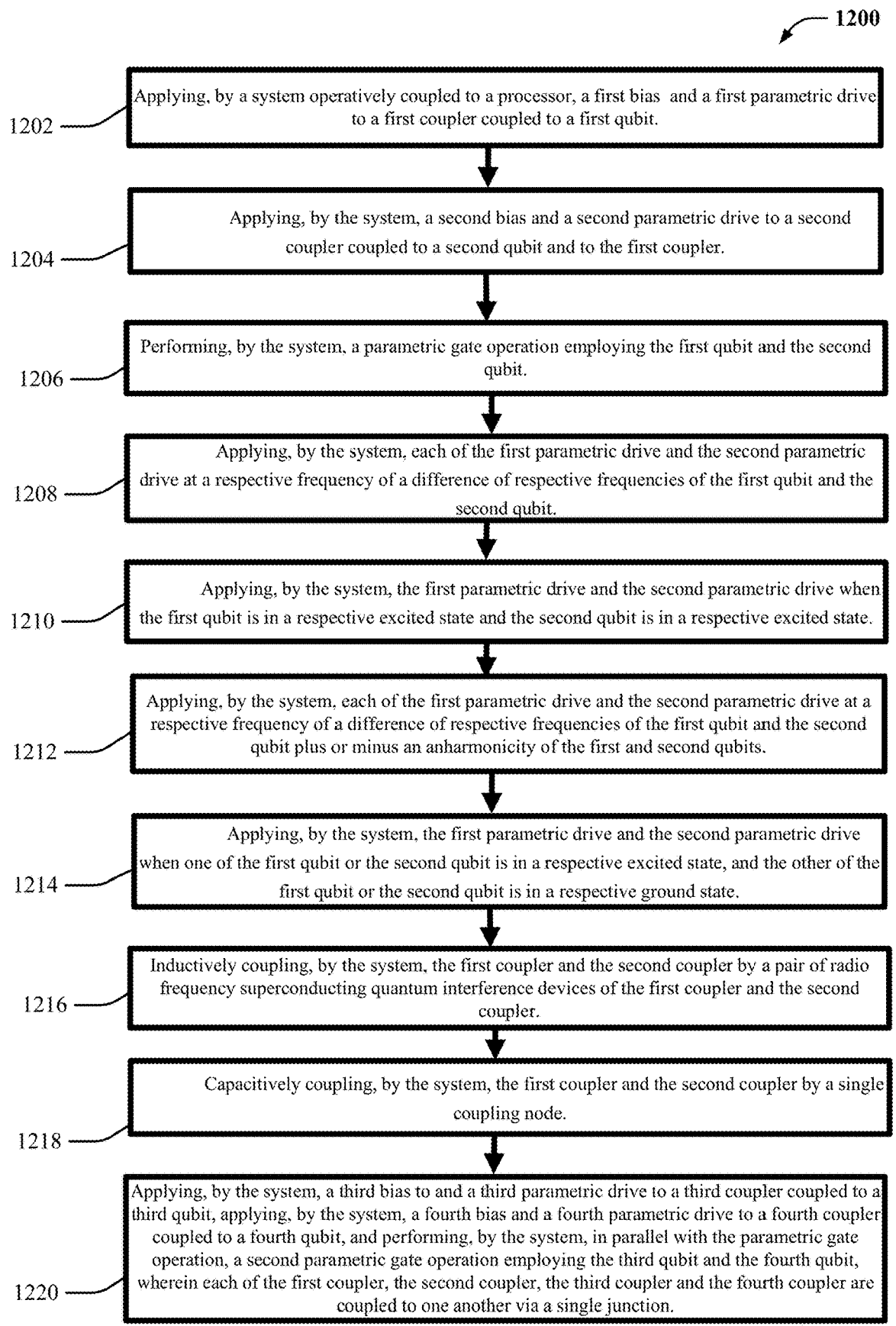
FIG. 12 illustrates a process flow for a method of use of an electronic device in accordance with one or more embodiments described herein.

Next, FIG. 12 illustrates a flow diagram of an example, non-limiting method 1200 that can provide a process to at least partially use an electronic device in accordance with one or more embodiments described herein, such as the non-limiting devices of FIGS. 1, 2, 4 and/or 8-10. Repetitive description of like elements and/or processes employed in respective embodiments is omitted for sake of brevity.

At 1202, the non-limiting method 1200 can comprise applying, by a system operatively coupled to a processor (e.g., by quantum operation component 103), a first bias and a first parametric drive to a first coupler coupled to a first qubit.

At 1204, the non-limiting method 1200 can comprise applying, by the system (e.g., by quantum operation component 103), a second bias and a second parametric drive to a second coupler coupled to a second qubit and to the first coupler.

At 1206, the non-limiting method 1200 can comprise performing, by the system (e.g., by quantum operation component 103), a parametric gate operation employing the first qubit and the second qubit.

At 1208, the non-limiting method 1200 can comprise applying, by the system (e.g., by quantum operation component 103), the first parametric drive and the second parametric drive at a respective frequency of a difference of respective frequencies of the first qubit and the second qubit.

At 1210, the non-limiting method 1200 can comprise applying, by the system (e.g., by quantum operation component 103), the first parametric drive and the second parametric drive when the first qubit is in a respective excited state and the second qubit is in a respective excited state.

At 1212, the non-limiting method 1200 can comprise applying, by the system (e.g., by quantum operation component 103), the first parametric drive and the second parametric drive at a respective frequency of a difference of respective frequencies of the first qubit and the second qubit plus or minus an anharmonicity of the first and second qubits.

At 1214, the non-limiting method 1200 can comprise applying, by the system (e.g., by quantum operation component 103), the first parametric drive and the second parametric drive when one of the first qubit or the second qubit is in a respective excited state, and the other of the first qubit or the second qubit is in a respective ground state.

At 1216, the non-limiting method 1200 can comprise inductively coupling, by the system (e.g., by quantum operation component 103), the first coupler and the second coupler by a pair of radio frequency superconducting quantum interference devices of the first coupler and the second coupler.

At 1218, the non-limiting method 1200 can comprise capacitively coupling, by the system (e.g., by quantum operation component 103), the first coupler and the second coupler by a single coupling node.

At 1218, the non-limiting method 1200 can comprise applying, by the system (e.g., by quantum operation component 103), a third bias and a third parametric drive to a third coupler coupled to a third qubit, applying, by the system (e.g., by quantum operation component 103), a fourth bias and a fourth parametric drive to a fourth coupler coupled to a fourth qubit, and performing, by the system (e.g., by quantum operation component 103), in parallel with the parametric gate operation, a second parametric gate operation employing the third qubit and the fourth qubit, wherein the first coupler, the second coupler, the third coupler and the fourth coupler are coupled to one another by a single junction.

For simplicity of explanation, the computer-implemented and non-computer-implemented methodologies provided herein are depicted and/or described as a series of acts. It is to be understood that the subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture for transporting and transferring the computer-implemented methodologies to computers. The term article of manufacture, as used herein, is intended to encompass a computer program accessible from any computer-readable device or storage media.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

In summary, one or more systems, devices, and/or methods of manufacture and/or use provided herein relate to a quantum computing process to achieve higher connectivity of qubits to more than nearest neighbors and/or to a plurality of nearest neighbors. A system can comprise a tunable first coupler coupled to a first qubit, a tunable second coupler coupled to a second qubit, and a junction coupling the first coupler and the second coupler each being parametrically drivable. Each of the first coupler and the second coupler can comprise a superconducting quantum interference device or a Josephson junction. The junction can comprise a central hub or central node separately coupled to each of the first coupler and the second coupler. The first coupler and the second coupler can be configured to capacitively or inductively couple the first qubit and the second qubit to one another to perform a controlled-Z (CZ) gate or an iSWAP gate.

An advantage of one or more of the above-indicated electronic devices, systems and/or methods can be higher quantum volume and improved quantum algorithm implementations and/or demonstrations. This can be due to reduction in gates, reduction in swaps, and/or reduced error (or less introduction of error).

Yet another advantage of the one or more embodiments described herein can be use of plural electronic devices and/or systems in combination with one another to reduce thermal population of loading.

Still another advantage of the one or more embodiments described herein can be execution of plural high connectivity operations, such as at least partially at a same time as one another, employing a same electronic device and/or system, such as having four or more qubits. Indeed, such electronic device can employ a single junction that is separately coupled to each of the four qubits.

In view of the one or more embodiments described herein, a practical application of the systems, computer-implemented methods and/or computer program products described herein can be higher quantum volume throughput of a quantum system employing an electronic device as described herein. Such is a useful and practical application of computers, thus providing enhanced (e.g., improved and/or optimized) operation of quantum circuits, such as with the electronic device being comprised by a quantum logic circuit having plural qubits, such as about 27 qubits, or 1000 qubits, or more. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function within a quantum system that can receive as input a pulse to affect one or more qubits of one or more of the electronic devices and/or systems described herein.

Moreover, an electronic device and/or method described herein can be implemented in one or more domains, such as quantum domains, to enable scaled quantum program executions. Indeed, use of an electronic device as described herein can be scalable, such as where the elements of the embodiments described herein can be usable in quantity in a same overall quantum logic circuit or quantum processor of a quantum system. One or more qubit couplings/quantum operations, such as parametric operations, can be performed at a same time as one another using a same electronic device as described herein.

One or more systems and/or electronic devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. Systems, computer-implemented methods and/or computer program products described herein are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively couple qubits and/or execute a quantum gate as the one or more embodiments described herein. Moreover, neither can the human mind nor a human with pen and paper conduct one or more of these processes, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing one or more of the one or more operations described herein.

Figure 14:
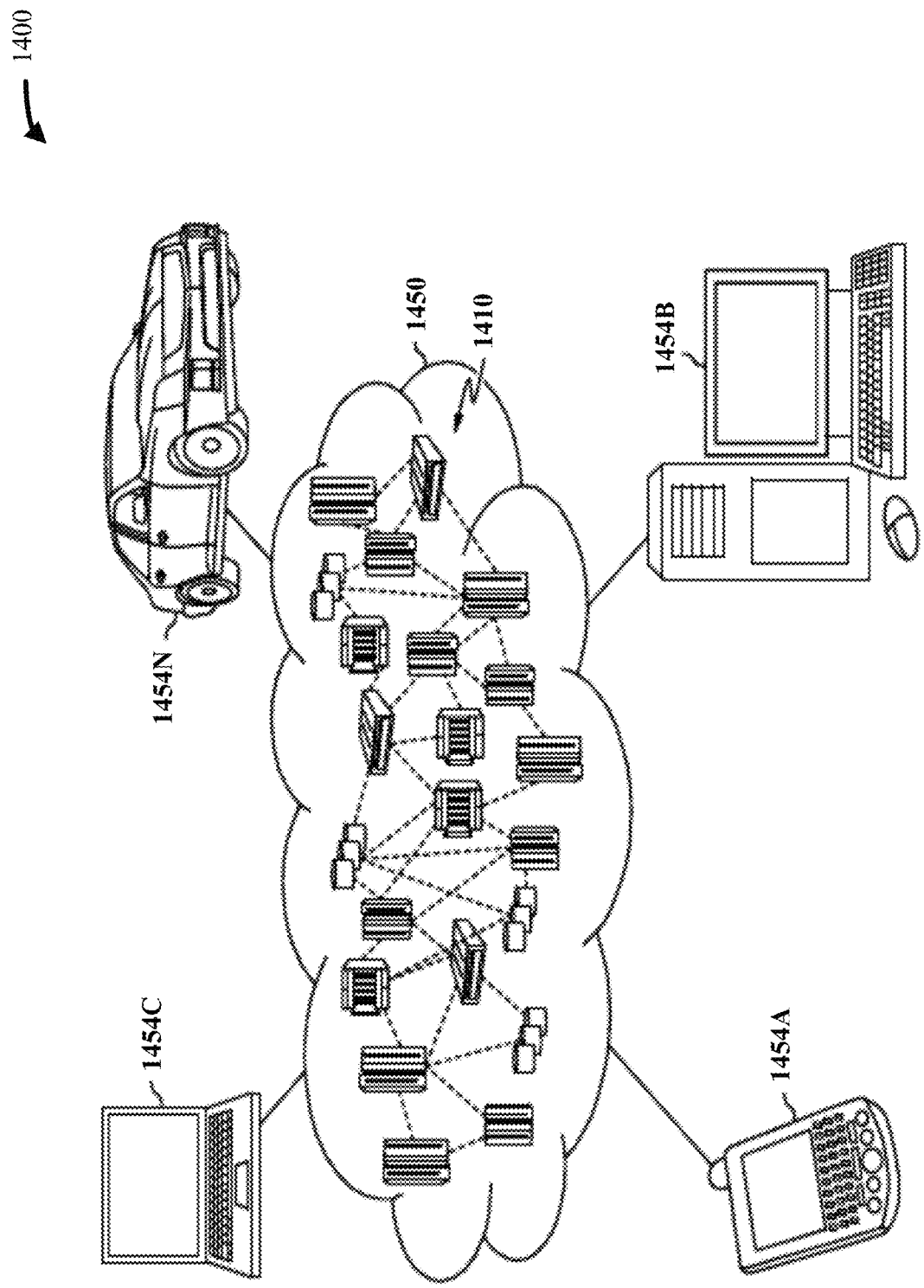
FIG. 14 illustrates a block diagram of an example, non-limiting, cloud computing environment in accordance with one or more embodiments described herein.
Figure 15:
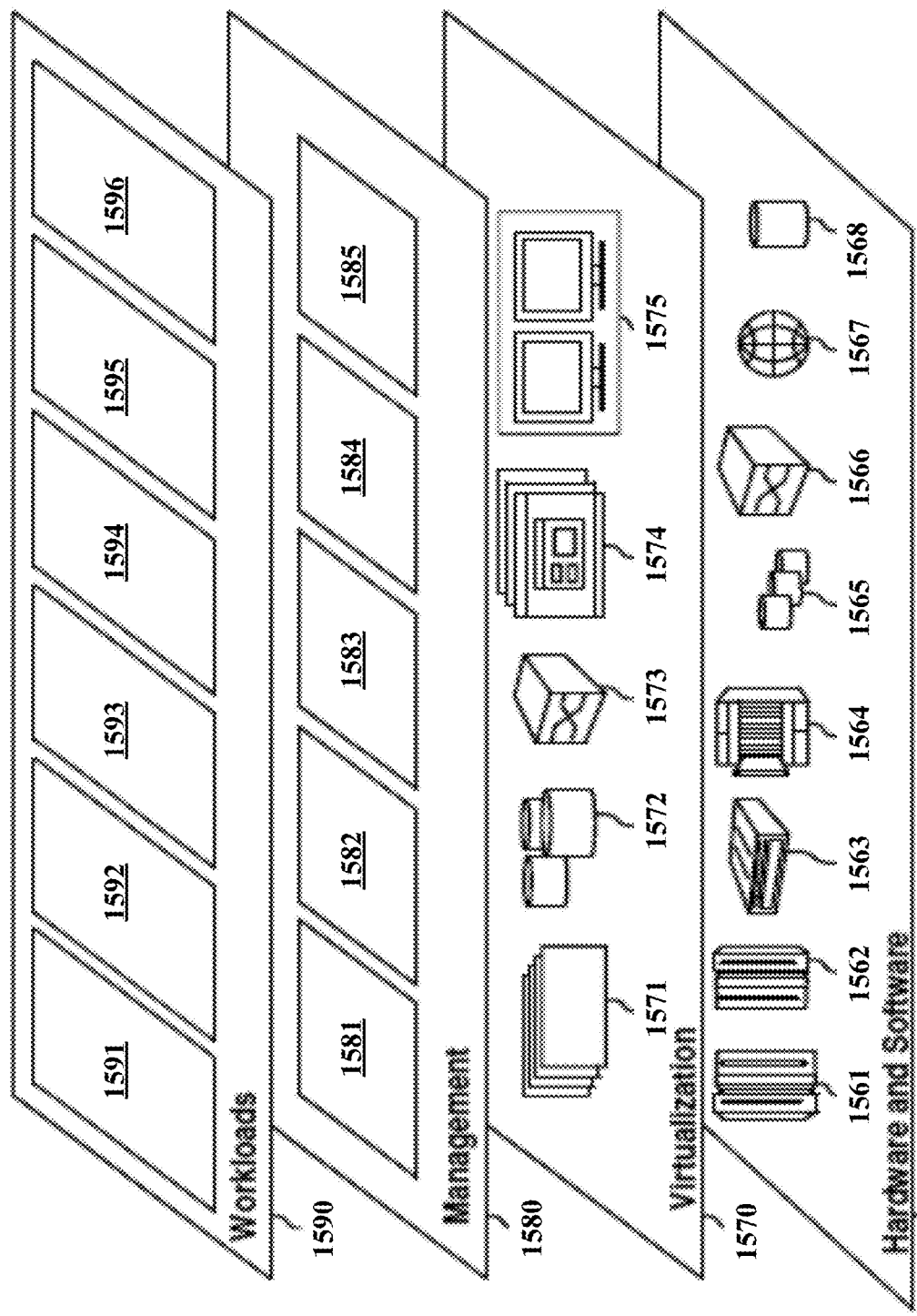
FIG. 15 illustrates a block diagram of example, non-limiting, abstraction model layers in accordance with one or more embodiments described herein.

Turning next to FIGS. 13-15, a detailed description is provided of additional context for the one or more embodiments described herein at FIGS. 1-12.

FIG. 13 and the following discussion are intended to provide a brief, general description of a suitable operating environment 1300 in which one or more embodiments described herein at FIGS. 1-12 can be implemented. For example, one or more components and/or other aspects of embodiments described herein can be implemented in or be associated with, such as accessible via, the operating environment 1300. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the aforedescribed methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference still to FIG. 13, the example operating environment 1300 for implementing one or more embodiments of the aspects described herein can include a computer 1302, the computer 1302 including a processing unit 1306, a system memory 1304 and/or a system bus 1308. One or more aspects of the processing unit 1306 can be applied to processors associated with the devices of FIGS. 1, 2, 4 and/or 8-10.

Memory 1304 can store one or more computer and/or machine readable, writable and/or executable components and/or instructions that, when executed by processing unit 1306 (e.g., a classical processor, a quantum processor and/or like processor), can provide performance of operations defined by the executable component(s) and/or instruction(s). For example, memory 1304 can store computer and/or machine readable, writable and/or executable components and/or instructions that, when executed by processing unit 1306, can provide execution of the one or more functions described herein relating to the devices of FIGS. 1, 2, 4 and/or 8-10, as described herein with or without reference to the one or more figures of the one or more embodiments.

Memory 1304 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 1306 can comprise one or more types of processors and/or electronic circuitry (e.g., a classical processor, a quantum processor and/or like processor) that can implement one or more computer and/or machine readable, writable and/or executable components and/or instructions that can be stored at memory 1304. For example, processing unit 1306 can perform one or more operations that can be specified by computer and/or machine readable, writable and/or executable components and/or instructions including, but not limited to, logic, control, input/output (I/O), arithmetic and/or the like. In one or more embodiments, processing unit 1306 can be any of one or more commercially available processors. In one or more embodiments, processing unit 1306 can comprise one or more central processing unit, multi-core processor, microprocessor, dual microprocessors, microcontroller, System on a Chip (SOC), array processor, vector processor, quantum processor and/or another type of processor. The examples of processing unit 1306 can be employed to implement one or more embodiments described herein.

The system bus 1308 can couple system components including, but not limited to, the system memory 1304 to the processing unit 1306. The system bus 1308 can comprise one or more types of bus structure that can further interconnect to a memory bus (with or without a memory controller), a peripheral bus and/or a local bus using one or more of a variety of commercially available bus architectures. The system memory 1304 can include ROM 1310 and/or RAM 1312. A basic input/output system (BIOS) can be stored in a non-volatile memory such as ROM, erasable programmable read only memory (EPROM) and/or EEPROM, which BIOS contains the basic routines that help to transfer information among elements within the computer 1302, such as during startup. The RAM 1312 can include a high-speed RAM, such as static RAM for caching data.

The computer 1302 can include an internal hard disk drive (HDD) 1314 (e.g., EIDE, SATA), one or more external storage devices 1316 (e.g., a magnetic floppy disk drive (FDD), a memory stick or flash drive reader, a memory card reader and/or the like) and/or a drive 1320, e.g., such as a solid state drive or an optical disk drive, which can read or write from a disk 1322, such as a CD-ROM disc, a DVD, a BD and/or the like. Additionally, and/or alternatively, where a solid state drive is involved, disk 1322 could not be included, unless separate. While the internal HDD 1314 is illustrated as located within the computer 1302, the internal HDD 1314 can also be configured for external use in a suitable chassis (not shown). Additionally, while not shown in operating environment 1300, a solid state drive (SSD) can be used in addition to, or in place of, an HDD 1314. The HDD 1314, external storage device(s) 1316 and drive 1320 can be connected to the system bus 1308 by an HDD interface 1324, an external storage interface 1326 and a drive interface 1328, respectively. The HDD interface 1324 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1302, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 1312, including an operating system 1330, one or more applications 1332, other program modules 1334 and/or program data 1336. All or portions of the operating system, applications, modules and/or data can also be cached in the RAM 1312. The systems and/or methods described herein can be implemented utilizing one or more commercially available operating systems and/or combinations of operating systems.

Computer 1302 can optionally comprise emulation technologies. For example, a hypervisor (not shown) or other intermediary can emulate a hardware environment for operating system 1330, and the emulated hardware can optionally be different from the hardware illustrated in FIG. 13. In a related embodiment, operating system 1330 can comprise one virtual machine (VM) of multiple VMs hosted at computer 1302. Furthermore, operating system 1330 can provide runtime environments, such as the JAVA runtime environment or the .NET framework, for applications 1332. Runtime environments are consistent execution environments that can allow applications 1332 to run on any operating system that includes the runtime environment. Similarly, operating system 1330 can support containers, and applications 1332 can be in the form of containers, which are lightweight, standalone, executable packages of software that include, e.g., code, runtime, system tools, system libraries and/or settings for an application.

Further, computer 1302 can be enabled with a security module, such as a trusted processing module (TPM). For instance, with a TPM, boot components hash next in time boot components and wait for a match of results to secured values before loading a next boot component. This process can take place at any layer in the code execution stack of computer 1302, e.g., applied at application execution level and/or at operating system (OS) kernel level, thereby enabling security at any level of code execution.

An entity can enter and/or transmit commands and/or information into the computer 1302 through one or more wired/wireless input devices, e.g., a keyboard 1338, a touch screen 1340 and/or a pointing device, such as a mouse 1342. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 1306 through an input device interface 1344 that can be coupled to the system bus 1308, but can be connected by other interfaces, such as a parallel port, an IEEE 1394 serial port, a game port, a USB port, an IR interface, a BLUETOOTH® interface and/or the like.

A monitor 1346 or other type of display device can be alternatively and/or additionally connected to the system bus 1308 via an interface, such as a video adapter 1348. In addition to the monitor 1346, a computer typically includes other peripheral output devices (not shown), such as speakers, printers and/or the like.

The computer 1302 can operate in a networked environment using logical connections via wired and/or wireless communications to one or more remote computers, such as a remote computer(s) 1350. The remote computer(s) 1350 can be a workstation, a server computer, a router, a personal computer, portable computer, microprocessor-based entertainment appliance, a peer device and/or other common network node, and typically includes many or all of the elements described relative to the computer 1302, although, for purposes of brevity, only a memory/storage device 1352 is illustrated. Additionally, and/or alternatively, the computer 1302 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that supports communicating information among one or more embodiments described herein and external systems, sources and/or devices (e.g., computing devices, communication devices and/or the like).

The logical connections depicted include wired/wireless connectivity to a local area network (LAN) 1354 and/or larger networks, e.g., a wide area network (WAN) 1356. LAN and WAN networking environments can be commonplace in offices and companies and can facilitate enterprise-wide computer networks, such as intranets, all of which can connect to a global communications network, e.g., the Internet.

When used in a LAN networking environment, the computer 1302 can be connected to the local network 1354 through a wired and/or wireless communication network interface or adapter 1358. The adapter 1358 can facilitate wired and/or wireless communication to the LAN 1354, which can also include a wireless access point (AP) disposed thereon for communicating with the adapter 1358 in a wireless mode.

When used in a WAN networking environment, the computer 1302 can include a modem 1360 and/or can be connected to a communications server on the WAN 1356 via other means for establishing communications over the WAN 1356, such as by way of the Internet. The modem 1360, which can be internal and/or external and a wired and/or wireless device, can be connected to the system bus 1308 via the input device interface 1344. In a networked environment, program modules depicted relative to the computer 1302 or portions thereof can be stored in the remote memory/storage device 1352. The network connections shown are merely exemplary and one or more other means of establishing a communications link among the computers can be used.

When used in either a LAN or WAN networking environment, the computer 1302 can access cloud storage systems or other network-based storage systems in addition to, and/or in place of, external storage devices 1316 as described above, such as but not limited to, a network virtual machine providing one or more aspects of storage and/or processing of information. Generally, a connection between the computer 1302 and a cloud storage system can be established over a LAN 1354 or WAN 1356 e.g., by the adapter 1358 or modem 1360, respectively. Upon connecting the computer 1302 to an associated cloud storage system, the external storage interface 1326 can, such as with the aid of the adapter 1358 and/or modem 1360, manage storage provided by the cloud storage system as it would other types of external storage. For instance, the external storage interface 1326 can be configured to provide access to cloud storage sources as if those sources were physically connected to the computer 1302.

The computer 1302 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 15, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 1450 described below with reference to illustration 1400 of FIG. 14, and/or with reference to the one or more functional abstraction layers (e.g., quantum software and/or the like) described below with reference to FIG. 15, to execute one or more operations in accordance with one or more embodiments described herein. For example, cloud computing environment 1450 and/or one or more of the functional abstraction layers 1560, 1570, 1580 and/or 1590 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 1300 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 1300 can be employed to use hardware and/or software to solve problems that are highly technical in nature, that are not abstract and/or that cannot be performed as a set of mental acts by a human.

Referring now to details of one or more aspects illustrated at FIG. 14, the illustrative cloud computing environment 1450 is depicted. As shown, cloud computing environment 1450 includes one or more cloud computing nodes 1410 with which local computing devices used by cloud consumers, such as, for example, personal digital assistant (PDA) or cellular telephone 1454A, desktop computer 1454B, laptop computer 1454C and/or automobile computer system 1454N can communicate. Although not illustrated in FIG. 14, cloud computing nodes 1410 can further comprise a quantum platform (e.g., quantum computer, quantum hardware, quantum software and/or the like) with which local computing devices used by cloud consumers can communicate. Cloud computing nodes 1410 can communicate with one another. They can be grouped (not shown) physically or virtually, in one or more networks, such as Private, Community, Public, or Hybrid clouds as described hereinabove, or a combination thereof. This allows cloud computing environment 1450 to offer infrastructure, platforms and/or software as services for which a cloud consumer does not need to maintain resources on a local computing device. It is understood that the types of computing devices 1454A-N shown in FIG. 14 are intended to be illustrative only and that cloud computing nodes 1410 and cloud computing environment 1450 can communicate with any type of computerized device over any type of network and/or network addressable connection (e.g., using a web browser).

Referring now to details of one or more aspects illustrated at FIG. 15, a set 1500 of functional abstraction layers is shown, such as provided by cloud computing environment 1450 (FIG. 14). One or more embodiments described herein can be associated with, such as accessible via, one or more functional abstraction layers described below with reference to FIG. 15 (e.g., hardware and software layer 1560, virtualization layer 1570, management layer 1580 and/or workloads layer 1590). It should be understood in advance that the components, layers and/or functions shown in FIG. 15 are intended to be illustrative only and embodiments described herein are not limited thereto. As depicted, the following layers and/or corresponding functions are provided:

Hardware and software layer 1560 can include hardware and software components. Examples of hardware components include: mainframes 1561; RISC (Reduced Instruction Set Computer) architecture-based servers 1562; servers 1563; blade servers 1564; storage devices 1565; and/or networks and/or networking components 1566. In one or more embodiments, software components can include network application server software 1567, quantum platform routing software 1568; and/or quantum software (not illustrated in FIG. 15).

Virtualization layer 1570 can provide an abstraction layer from which the following examples of virtual entities can be provided: virtual servers 1571; virtual storage 1572; virtual networks 1573, including virtual private networks; virtual applications and/or operating systems 1574; and/or virtual clients 1575.

In one example, management layer 1580 can provide the functions described below. Resource provisioning 1581 can provide dynamic procurement of computing resources and other resources that can be utilized to perform tasks within the cloud computing environment. Metering and Pricing 1582 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1583 can provide access to the cloud computing environment for consumers and system administrators. Service level management 1584 can provide cloud computing resource allocation and/or management such that required service levels are met. Service Level Agreement (SLA) planning and fulfillment 1585 can provide pre-arrangement for, and procurement of, cloud computing resources for which a future requirement is anticipated in accordance with an SLA.

Workloads layer 1590 can provide examples of functionality for which the cloud computing environment can be utilized. Non-limiting examples of workloads and functions which can be provided from this layer include: mapping and navigation 1591; software development and lifecycle management 1592; virtual classroom education delivery 1593; data analytics processing 1594; transaction processing 1595; and/or application transformation software 1596.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. An electronic device comprising:
   a tunable first coupler coupled to a first qubit;
   a tunable second coupler coupled to a second qubit; and
   a junction coupling the first coupler and the second coupler,
   wherein the first coupler and the second coupler are parametrically drivable.

2. The electronic device of claim 1, wherein the first coupler and the second coupler comprise superconducting quantum interference devices or Josephson junctions.

3. The electronic device of claim 1, wherein the junction comprises a central hub or central node separately coupled to the first coupler and the second coupler.

4. The electronic device of claim 3, wherein the junction comprises a central hub, and wherein the central hub comprises a loop of series-coupled inductors.

5. The electronic device of claim 1, further comprising:
   a third coupler coupled to a third qubit, wherein the junction couples the first coupler, the second coupler and the third coupler, wherein the third coupler is parametrically drivable, wherein the junction is separately coupled to the first coupler, the second coupler and the third coupler.

6. The electronic device of claim 1, wherein the junction provides the only coupling between the first qubit and the second qubit.

7. The electronic device of claim 1, wherein the first coupler and the second coupler are configured to capacitively or inductively couple the first qubit and the second qubit to one another, and are configured to perform a controlled-Z (CZ) gate employing the first qubit and the second qubit.

8. The electronic device of claim 1, wherein the first coupler and the second coupler are configured to capacitively or inductively couple the first qubit and the second qubit to one another, and are configured to perform an iSWAP gate employing the first qubit and the second qubit.

9. A method of performing a quantum gate operation, the method comprising:
applying, by a system operatively coupled to a processor, a first bias and a first parametric drive to a first coupler coupled to a first qubit;
applying, by the system, a second bias and a second parametric drive to a second coupler coupled to a second qubit and to the first coupler; and
performing, by the system, a parametric gate operation employing the first qubit and the second qubit.

10. The method of claim 9, further comprising:
applying, by the system, the first parametric drive and the second parametric drive at a respective frequency of a difference of respective frequencies of the first qubit and the second qubit.

11. The method of claim 10, further comprising:
applying, by the system, the first parametric drive and the second parametric drive when the first qubit is in a respective excited state and the second qubit is in a respective excited state.

12. The method of claim 9, further comprising:
applying, by the system, the first parametric drive and the second parametric drive at a respective frequency of a difference of respective frequencies of the first qubit and the second qubit plus or minus an anharmonicity of the first and second qubits.

13. The method of claim 12, further comprising:
applying, by the system, the first parametric drive and the second parametric drive when one of the first qubit or the second qubit is in a respective excited state, and the other of the first qubit or the second qubit is in a respective ground state.

14. The method of claim 9, further comprising:
inductively coupling, by the system, the first coupler and the second coupler by a pair of radio frequency superconducting quantum interference devices of the first coupler and the second coupler.

15. The method of claim 9, further comprising:
capacitively coupling, by the system, the first coupler and the second coupler by a single coupling node.

16. The method of claim 9, further comprising:
applying, by the system, a third bias and a third parametric drive to a third coupler coupled to a third qubit;
applying, by the system, a fourth bias and a fourth parametric drive to a fourth coupler coupled to a fourth qubit; and
performing, by the system, in parallel with the parametric gate operation, a second parametric gate operation employing the third qubit and the fourth qubit,
wherein the first coupler, the second coupler, the third coupler and the fourth coupler are coupled to one another by a single junction.

17. An electronic device comprising:
a plurality of tunable couplers, comprising superconducting quantum interference devices, and separately coupled to respective qubits; and
a junction coupling the plurality of tunable couplers by all-to-all coupling, wherein the first coupler and the second coupler are parametrically drivable.

18. The electronic device of claim 17, wherein the junction comprises a central hub, wherein the central hub comprises a loop of series-coupled inductors, and wherein the number of series-coupled inductors is equal to the number of tunable couplers of the plurality of tunable couplers.

19. The electronic device of claim 17, wherein the plurality of tunable couplers are configured to capacitively or inductively couple a pair of the respective qubits to one another, and are configured to perform a controlled-Z (CZ) gate or an iSWAP gate employing the pair of the respective qubits.

20. The electronic device of claim 17, wherein the plurality of tunable couplers and the junction are jointly configured to perform a first parametric gate operation employing a pair of tunable couplers of the plurality of tunable couplers, and to perform, in parallel with the first parametric gate operation, a second parametric gate operation employing a pair of different tunable couplers of the plurality of tunable couplers.

* * * * *